United States Patent
Jeon et al.

(10) Patent No.: US 11,782,477 B2
(45) Date of Patent: Oct. 10, 2023

(54) DISPLAY APPARATUS AND WIRING FOR INPUT SENSING SECTION

(71) Applicant: Samsung Display Co., Ltd., Yongin-si (KR)

(72) Inventors: Yujin Jeon, Yongin-si (KR); Deokjung Kim, Yongin-si (KR); Sukyoung Kim, Yongin-si (KR); Iljoo Kim, Yongin-si (KR); Youngsoo Yoon, Yongin-si (KR); Wonse Lee, Yongin-si (KR); Yunkyeong In, Yongin-si (KR); Donghyeon Jang, Yongin-si (KR); Hyunji Cha, Yongin-si (KR); Wonjun Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/938,837

(22) Filed: Oct. 7, 2022

(65) Prior Publication Data
US 2023/0036631 A1 Feb. 2, 2023

Related U.S. Application Data

(63) Continuation of application No. 17/011,938, filed on Sep. 3, 2020, now Pat. No. 11,467,627.

(30) Foreign Application Priority Data

Oct. 2, 2019 (KR) .................. 10-2019-0122406

(51) Int. Cl.
*H01L 51/52* (2006.01)
*G06F 1/16* (2006.01)
(Continued)

(52) U.S. Cl.
CPC .......... *G06F 1/1605* (2013.01); *H10K 50/844* (2023.02); *H10K 59/00* (2023.02);
(Continued)

(58) Field of Classification Search
CPC ... G06F 1/1605; G06F 1/1637; H10K 50/844; H10K 59/00; H10K 59/124; H10K 59/60;
(Continued)

(56) References Cited

U.S. PATENT DOCUMENTS 9,640,681 B2 5/2017 Min
10,338,644 B2 7/2019 Jung et al.
(Continued)

FOREIGN PATENT DOCUMENTS

CN 108957881 A * 12/2018 ........... G02F 1/1333
CN 109637373 A 4/2019
(Continued)

OTHER PUBLICATIONS

English Machine Translation of WO 2020066011 (Year: 2023).*
English Machine Translation of CN 108957881 (Year: 2023).*

*Primary Examiner* — Donald L Raleigh
(74) *Attorney, Agent, or Firm* — Lewis Roca Rothgerber Christie LLP

(57) ABSTRACT

A display apparatus includes a substrate including a transmission area, a display area, and a first non-display area between the transmission area and the display area, a display layer including display elements and bypass lines, an encapsulation member that covers the display elements and the bypass lines, a metal layer on the encapsulation member, and including a first hole corresponding to the transmission area, and an optical functional section including a second hole corresponding to the transmission area, wherein a first perpendicular distance from a center line, which passes through a center of the transmission area and is perpendicu- (Continued)

lar to an upper surface of the substrate, to an edge of the first hole may be less than a second perpendicular distance from the center line to an edge of the second hole.

20 Claims, 18 Drawing Sheets

(51) Int. Cl.
*H10K 50/844* (2023.01)
*H10K 59/00* (2023.01)
*H10K 59/60* (2023.01)
*H10K 59/65* (2023.01)
*H10K 59/124* (2023.01)

(52) U.S. Cl.
CPC ........... *H10K 59/124* (2023.02); *H10K 59/60* (2023.02); *H10K 59/65* (2023.02)

(58) Field of Classification Search
CPC .... H10K 59/65; H10K 59/131; H10K 59/126; H10K 59/40; H10K 50/80; H10K 50/85; H04M 1/026; H04M 1/0264; H04M 1/0266

See application file for complete search history.

(56) References Cited

U.S. PATENT DOCUMENTS

| 10,449,901 | B2 | 10/2019 | Park et al. |
| 2019/0130848 | A1 | 5/2019 | Kim et al. |
| 2022/0077193 | A1 | 3/2022 | Shin |

FOREIGN PATENT DOCUMENTS

| KR | 10-2013-0131017 A | 12/2013 | |
| KR | 10-2017-0030314 A | 3/2017 | |
| KR | 10-2017-0141311 A | 12/2017 | |
| KR | 10-2019-0046420 A | 5/2019 | |
| WO | WO-2020066011 A1 * | 4/2020 | ......... H01L 27/3276 |
| WO | WO 2020/158962 A1 | 8/2020 | |

* cited by examiner

DISPLAY APPARATUS AND WIRING FOR INPUT SENSING SECTION

CROSS-REFERENCE TO RELATED APPLICATION

This application is a continuation of U.S. patent application Ser. No. 17/011,938, filed Sep. 3, 2020, which claims priority to and the benefit of Korean Patent Application No. 10-2019-0122406, filed on Oct. 2, 2019, in the Korean Intellectual Property Office, the entire content of which is incorporated by reference.

BACKGROUND

1. Field

One or more embodiments relate to display apparatuses, and for example, to a display apparatus including a display panel having a transmission area.

2. Description of Related Art

Recently, display apparatuses have been used for various purposes. Also, as display apparatuses have become thinner and lighter, their range of use has widened.

As an area occupied by a display area in a display apparatus has been expanded (e.g., has increased relative to the overall size of the display device), various functions combined or associated with a display apparatus have been added. As a method of adding various functions while increasing the area, research has been conducted into a display apparatus having an area for adding various functions other than an image display inside a display area.

SUMMARY

One or more embodiments include a display apparatus including a display panel having a transmission area inside a display area, which may minimize or reduce the influence of external light. However, the preceding description merely provides examples and the scope of the present disclosure is not limited thereto.

Additional aspects of embodiments will be set forth in part in the description which follows and, in part, will be apparent from the description, or may be learned by practice of the presented embodiments of the disclosure.

According to one or more embodiments, a display apparatus includes a substrate including a transmission area, a display area surrounding the transmission area, and a first non-display area between the transmission area and the display area, a display layer including display elements in the display area and bypass lines in the first non-display area, an encapsulation member that covers the display elements and the bypass lines, a metal layer on the encapsulation member, overlapping the bypass lines, and including a first hole corresponding to the transmission area, and an optical functional section including a second hole corresponding to the transmission area over the metal layer, wherein a first perpendicular distance d1 from a center line, which passes through a center of the transmission area and is perpendicular to an upper surface of the substrate, to an edge of the first hole is less than a second perpendicular distance d2 from the center line to an edge of the second hole, and the first perpendicular distance d1 is less than a third perpendicular distance d3 from the center line to a bypass line closest to the transmission area among the bypass lines.

In an embodiment, the third perpendicular distance d3 may be less than the second perpendicular distance d2.

In an embodiment, a difference between the first perpendicular distance d1 and the third perpendicular distance d3 may be about 5 µm to about 10 µm.

In an embodiment, the display apparatus may further include an input sensing section on the encapsulation member and including sensing electrodes and trace lines electrically coupled to the sensing electrodes, wherein the metal layer may be in a same layer as the input sensing section and may be electrically insulated from the input sensing section.

In an embodiment, the metal layer may include a same material as the trace lines.

In an embodiment, the metal layer may have a ring shape.

In an embodiment, the display layer may include a plurality of inorganic insulating layers, at least one of the plurality of inorganic insulating layers may include a fourth hole corresponding to the transmission area, and a fourth perpendicular distance d4 from the center line to the fourth hole may be less than the first perpendicular distance d1.

In an embodiment, at least one of the plurality of inorganic insulating layers may continuously surround the transmission area.

In an embodiment, the display layer may include an opposite electrode provided in common to the display elements, the opposite electrode may include a fifth hole corresponding to the transmission area, and a fifth perpendicular distance d5 from the center line to the fifth hole may be less than the first perpendicular distance d1.

In an embodiment, the display layer may include a plurality of inorganic insulating layers and an opposite electrode, the plurality of inorganic insulating layers may include a fourth hole corresponding to the transmission area, and the opposite electrode may be at a side wall of the fourth hole.

In an embodiment, the display apparatus may further include a window over the optical functional section, and a transparent adhesive layer between the optical functional section and the window.

In an embodiment, at least one of the substrate or the sealing member may include a glass material.

According to one or more embodiments, a display apparatus includes a substrate including a transmission area, a display area surrounding the transmission area, and a first non-display area between the transmission area and the display area, a display layer including display elements in the display area and bypass lines in the first non-display area, an encapsulation member that covers the display elements and the bypass lines, a metal layer on the encapsulation member, overlapping the bypass lines, and including a first hole corresponding to the transmission area, and an optical functional section including a second hole corresponding to the transmission area and having a larger diameter than the first hole over the metal layer, wherein a first perpendicular distance d1 from a center line, which passes through a center of the transmission area and is perpendicular to an upper surface of the substrate, to an edge of the first hole is less than a third perpendicular distance d3 from the center line to a bypass line closest to the transmission area among the bypass lines.

In an embodiment, the display apparatus may further include an input sensing section on the encapsulation member and including sensing electrodes and trace lines electrically coupled to the sensing electrodes, wherein the input sensing section may include at least one conductive layer including the sensing electrodes or the trace lines and an insulating layer on the conductive layer, and the metal layer may include a same material as the at least one conductive layer.

In an embodiment, the insulating layer may cover an edge of the metal layer defining the first hole.

In an embodiment, the third perpendicular distance d3 may be less than a second perpendicular distance d2 from the center line to an edge of the second hole.

In an embodiment, a difference between the first perpendicular distance d1 and the third perpendicular distance d3 may be about 5 µm to about 10 µm.

In an embodiment, the display layer may include a plurality of inorganic insulating layers and an opposite electrode provided in common to the display elements, and at least one of the plurality of inorganic insulating layers may include a fourth hole corresponding to the transmission area and a fourth perpendicular distance d4 from the center line to the fourth hole may be less than the first perpendicular distance d1.

In an embodiment, the opposite electrode may include a fifth hole corresponding to the transmission area, and a diameter of the fifth hole may be larger than a diameter of the fourth hole.

In an embodiment, the display apparatus may further include a sealant that surrounds the display area to bond the substrate to the encapsulation member.

BRIEF DESCRIPTION OF THE DRAWINGS

The above and other aspects and features of certain embodiments of the disclosure will be more apparent from the following description taken in conjunction with the accompanying drawings, in which.

DETAILED DESCRIPTION

Figure 1:
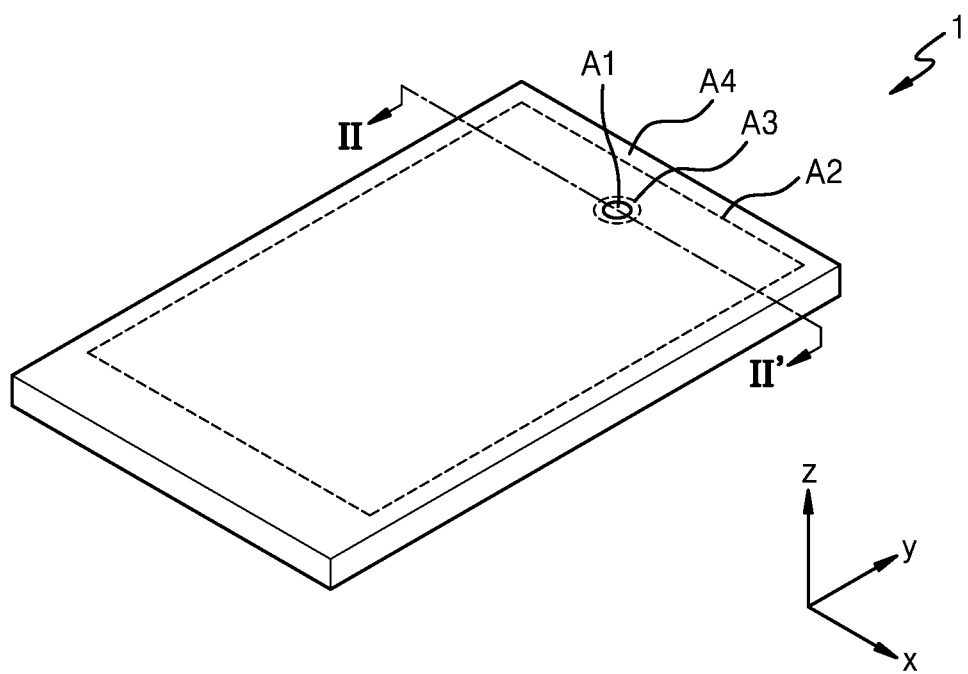
FIG. 1 is a perspective view schematically illustrating a display apparatus according to an embodiment.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of embodiments of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Hereinafter, embodiments of the present disclosure will be described in more detail with reference to the accompanying drawings, and in the following description, like reference numerals will denote like elements and redundant descriptions thereof will not be repeated in the interest of conciseness.

It will be understood that although terms such as "first" and "second" may be used herein to describe various components, these components should not be limited by these terms and these terms are only used to distinguish one component from another component.

As used herein, the singular forms "a," "an," and "the" are intended to include the plural forms as well, unless the context clearly indicates otherwise.

It will be understood that terms such as "comprise," "include," and "have," as used herein, specify the presence of stated features or components, but do not preclude the presence or addition of one or more other features or components.

It will be understood that when a layer, region, or component is referred to as being "on" another layer, region, or component, it may be "directly on" the other layer, region, or component or may be "indirectly on" the other layer, region, or component with one or more intervening layers, regions, or components therebetween.

Sizes of components in the drawings may be exaggerated for convenience of description. In other words, because the sizes and thicknesses of components in the drawings may be arbitrarily illustrated for convenience of description, the present disclosure is not limited thereto.

When a certain embodiment may be implemented differently, a process order may be performed differently from the described order. For example, two consecutively described processes may be performed substantially at the same time or performed in an order opposite to the described order.

It will be understood that when a layer, region, or component is referred to as being "coupled to" another layer, region, or component, it may be "directly coupled to" the other layer, region, or component or may be "indirectly coupled to" the other layer, region, or component with one or more intervening layers, regions, or components therebetween. For example, it will be understood that when a layer, region, or component is referred to as being "electrically coupled to" another layer, region, or component, it may be "directly electrically coupled to" the other layer, region, or component or may be "indirectly electrically coupled to" the other layer, region, or component with one or more intervening layers, regions, or components therebetween.

FIG. 1 is a perspective view schematically illustrating a display apparatus according to an embodiment.

Referring to FIG. 1, a display apparatus 1 may include a first area A1 and a second area A2 surrounding the first area A1. A plurality of pixels, for example, an array of pixels, may be arranged in the second area A2, and the second area A2 may be configured to display an image through the array of pixels. In some embodiments, the array of pixels, are arranged in the second area A2, but not the first area A1 (e.g., only the second area A2 may include pixels and the first area may not include any pixels). The second area A2 may correspond to an active area capable of displaying an image. The first area A1 may be entirely surrounded by the second area A2. The first area A1 may be an area in which a component capable of providing various suitable functions to the display apparatus 1 is arranged. For example, when the component includes a sensor, a camera, or the like using light, the first area A1 may correspond to a transmission area through which light (e.g., visible light, infrared light, and/or ultraviolet light) of the sensor or light (e.g., visible light, infrared light, and/or ultraviolet light) propagating to the camera may pass. In some embodiments, in the case where the component includes a sensor that uses sound, for example super sound (e.g., ultrasonic waves), the first area A1 corresponds to a transmission area that may transmit sound of the sensor. For example, the transmission area may transit sound (e.g., ultrasonic waves) to or from the sensor.

A third area A3 may be provided between the first area A1 and the second area A2. The third area A3 may be a non-display area in which pixels are not arranged, and lines bypassing the first area A1 may be arranged therein. For example, the third area A3 may not include any pixels. Similarly to the third area A3, a fourth area A4 surrounding the second area A2 may be a non-display area in which pixels are not arranged, and various suitable lines and internal circuits may be arranged in the fourth area A4. For example, the fourth area may not include any pixels.

Each pixel provided in the display apparatus 1 may include a light-emitting diode as a display element capable of emitting light (e.g., visible light) of a certain color. The light-emitting diode may include an organic light-emitting diode including an organic material as an emission layer. In some embodiments, the light-emitting diode may include an inorganic light-emitting diode. In some embodiments, the light-emitting diode may include a quantum dot as an emission layer. Hereinafter, for convenience of description, it is assumed that the light-emitting diode includes an organic light-emitting diode, but the present disclosure is not limited thereto.

FIG. 1 illustrates that the first area A1 is arranged at a middle (e.g., center) portion of the second area A2 in the widthwise direction (e.g., ±x direction) of the display apparatus 1; however, in other embodiments, the first area A1 may be arranged to be offset to the left side or the right side in the widthwise direction of the display apparatus 1. Also, the first area A1 may be arranged at various suitable positions such as at the upper side, at the center, or at the lower side in the lengthwise direction (e.g., ±y direction) of the display apparatus 1. As used herein, the term "±x direction" may refer to either direction along the X axis shown in FIG. 1, and the term "±y direction" may refer to either direction along the Y axis shown in FIG. 1. The Z axis shown in FIG. 1 is perpendicular or substantially perpendicular to the X and Y axes.

FIG. 1 illustrates that the display apparatus 1 includes one first area A1; however, in other embodiments, the display apparatus 1 may include a plurality of first areas A1.

Figure 2:
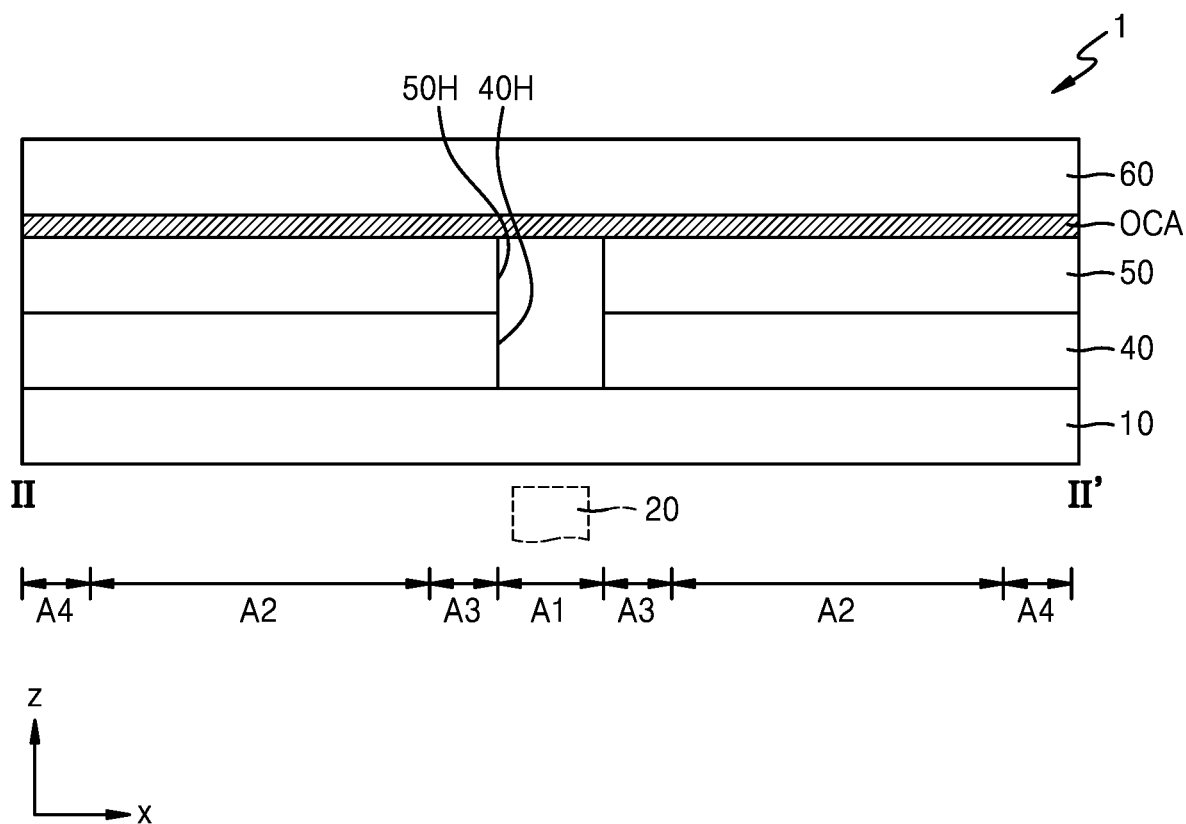
FIG. 2 is a cross-sectional view schematically illustrating a display apparatus according to an embodiment, which may correspond to a cross section of the display apparatus taken along line II-II' of FIG. 1.

FIG. 2 is a cross-sectional view schematically illustrating a display apparatus according to an embodiment, which may correspond to a cross-section of the display apparatus taken along line II-II' of FIG. 1.

Referring to FIG. 2, the display apparatus 1 may include a display panel 10, an input sensing section 40 arranged on the display panel 10, and an optical functional section 50, which may be covered by a window 60. The window 60 may be coupled to a component thereunder, for example, the optical functional section 50, through an adhesive layer such as an optically clear adhesive (OCA). The display apparatus 1 may be included in various suitable electronic apparatuses such as, for example, mobile phones, tablet PCs, notebook computers, or smart watches.

The display panel 10 may include a plurality of diodes arranged in the second area A2. The input sensing section 40 may be configured to acquire coordinate information according to an external input, for example, a touch event (e.g., a touch or near touch by a user). The input sensing section 40 may include a sensing electrode or a touch electrode and trace lines coupled to the sensing electrode or the touch electrode. The input sensing section 40 may be arranged on the display panel 10. The input sensing section 40 may be configured to sense an external input by a mutual cap method or a self cap method (e.g., a mutual capacitance method or a self capacitance method).

The input sensing section 40 may be directly formed on (e.g., may physically contact) the display panel 10. In some embodiments, the input sensing section 40 may be separately formed and then coupled to the display panel 10 through an adhesive layer such as an optical clear adhesive OCA. In an embodiment, as illustrated in FIG. 2, the input sensing section 40 may be directly formed on (e.g., may physically contact) the display panel 10, and in this case, no adhesive layer may be located between the input sensing section 40 and the display panel 10.

The optical functional section 50 may include an anti-reflection layer. The anti-reflection layer may be configured to reduce the reflectance of light (external light) incident from the outside through the window 60 toward the display panel 10. The anti-reflection layer may include a phase retarder and a polarizer. The phase retarder may be a film type or a liquid crystal coating type and may include a half wavelength ($\lambda/2$) phase retarder and/or a quarter wavelength ($\lambda/4$) phase retarder. The polarizer may also be a film type or a liquid crystal coating type. The film type may include a stretched synthetic resin film, and the liquid crystal coating type may include liquid crystals arranged in a set or certain arrangement. The phase retarder and the polarizer may further include, for example, a protective film.

In other embodiments, the anti-reflection layer may include a structure include color filters and a black matrix. The color filters may be arranged considering the color of light emitted from each of the subpixels of the display panel 10. For example, the color filters may be arranged according to the color of light respectively emitted from the subpixels of the display panel 10. In other embodiments, the anti-reflection layer may include a destructive interference structure. The destructive interference structure may include a first reflective layer and a second reflective layer arranged on different layers. The first reflected light and the second reflected light respectively reflected by the first reflective layer and the second reflective layer may destructively interfere with each other, and accordingly, the external light reflectance may be reduced.

The optical functional section 50 may include a lens layer. The lens layer may be configured to improve the light emission efficiency of light emitted from the display panel 10 or may be configured to reduce a color deviation (e.g., an unwanted change in color). The lens layer may include a layer having a concave or convex lens shape and/or may include a plurality of layers respectively having different refractive indexes. For example, the respective refractive indexes of the plurality of layers may be different from each other. The optical functional section 50 may include both the anti-reflection layer and the lens layer described above or may include any one of them.

The input sensing section 40 and the optical functional section 50 may each include a hole. For example, the input sensing section 40 may include a hole 40H passing through the top and bottom surfaces of the input sensing section 40, and the optical functional section 50 may include a hole 50H passing through the top and bottom surfaces of the optical functional section 50. The hole 40H of the input sensing section 40 and the hole 50H of the optical functional section 50 may be arranged in the first area A1 and may be arranged to correspond to each other.

When an adhesive layer between the window 60 and the optical functional section 50 includes an optical clear adhesive OCA, the adhesive layer may not include a hole corresponding to the first area A1.

A component 20 may be arranged in the first area A1. The component 20 may include an electronic element. For example, the component 20 may include an electronic element using light or sound (e.g., sends or receives sound (e.g., ultrasound waves), visible light, infrared light, and/or ultraviolet light and performs an operation based on the light received). For example, the electronic element may include a sensor such as an infrared sensor for receiving and using light, a camera for receiving light to capture an image, a sensor for outputting and sensing light or sound to measure a distance or recognize a fingerprint or the like, a miniature lamp for outputting light, a speaker for outputting sound, and/or a sensor for receiving sound (e.g., ultrasound waves). In the case of an electronic element using light, it may use light of various suitable wavelength bands such as visible light, infrared light, and ultraviolet light. In some embodiments, the first area A1 may be a transmission area through which light or sound output from the component 20 to the outside or propagating from the outside toward the electronic element may be transmitted.

In other embodiments, when the display apparatus 1 is used as a smart watch or a vehicle instrument panel, the component 20 may be a member such as a clock hand or a needle indicating certain information (e.g., vehicle speed). When the display apparatus 1 includes a clock hand or a vehicle instrument panel, the component 20 may be exposed to the outside through the window 60 and the window 60 may include an opening corresponding to the first area A1.

The component 20 may include one or more components capable of adding a certain function to the display apparatus 1 as described above or may include components such as accessories capable of improving the appearance or increasing the beauty of the display panel 10.

Figure 3:
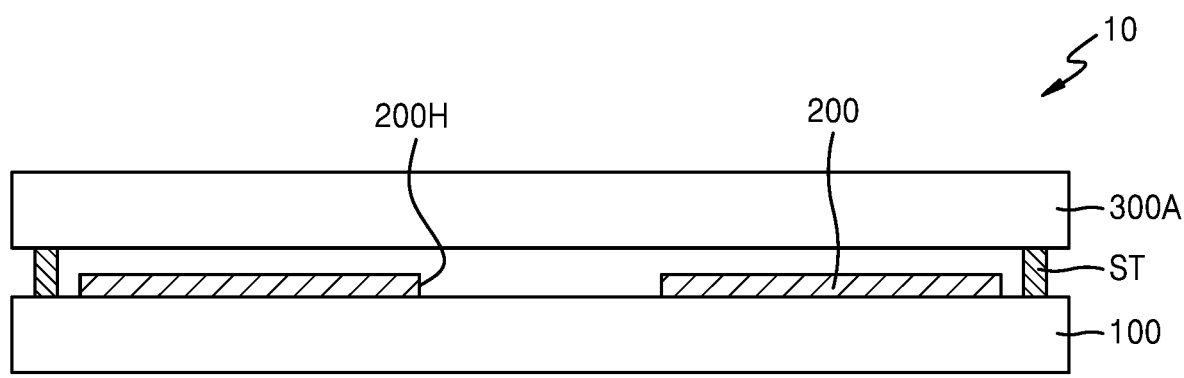
FIG. 3 is a cross-sectional view schematically illustrating a display panel according to an embodiment.

FIG. 3 is a cross-sectional view schematically illustrating a display panel according to an embodiment.

Referring to FIG. 3, the display panel 10 may include a display layer 200 arranged on a substrate 100. The substrate 100 may include a glass material and/or a polymer resin. For example, the substrate 100 may include a glass material having $SiO_2$ as a main component and/or may include a resin such as reinforced plastic.

The display layer 200 may be located to correspond to the second area A2 and may include a plurality of pixels. Each pixel included in the display layer 200 may include a pixel circuit and a display element electrically coupled to the pixel circuit. The pixel circuit may include a transistor and a storage capacitor, and the display element may include a light-emitting diode, for example, an organic light-emitting diode OLED.

The display layer 200 may be covered by an encapsulation substrate 300A. The encapsulation substrate 300A may include a glass material and/or a polymer resin. For example, the encapsulation substrate 300A may include a glass material having $SiO_2$ as a main component and/or may include a resin such as reinforced plastic. The encapsulation substrate 300A may be arranged to face the substrate 100, and a sealant ST may be arranged between the substrate 100 and the encapsulation substrate 300A. The sealant ST may be located in the fourth area A4 and may entirely surround the display layer 200 between the substrate 100 and the encapsulation substrate 300A. When viewed in a direction perpendicular to the upper surface of the substrate 100 (or in a plan view), the second area A2 may be entirely surrounded by the sealant ST.

The sealant ST may include an inorganic material and may include, for example, frit. The sealant ST may be formed by application by using a dispenser or a screen printing method. The term "frit" generally means a powder-form glass raw material; however, in the present disclosure, the frit may also include a paste form in which a laser or infrared absorber, an organic binder, a filler for reducing a thermal expansion coefficient, and/or the like are included in a main material such as $SiO_2$. The paste-form frit may be cured by removing the organic binder and moisture through a drying or firing process. The laser or infrared absorber may include a transition metal compound. Laser light may be used as a heat source for curing the sealant ST and bonding the substrate 100 to the encapsulation substrate 300A.

A portion of the display layer 200, for example, a portion corresponding to the first area A1, may be removed. In this regard, FIG. 3 illustrates that the display layer 200 includes a hole 200H corresponding to the first area A1 that is a transmission area. In addition to the pixel circuits and the display elements described above, the display layer 200 may further include insulating layers arranged between lines coupled to each pixel circuit, between electrodes, and/or between electrodes of the display element. For example, the holes 200H of the display layer 200 may be formed by overlapping the holes of the above insulating layers provided in the display layer 200.

FIG. 3 illustrates that the display layer 200 is sealed by the encapsulation substrate 300A and the sealant ST; however, in other embodiments, the display layer 200 may be covered by a thin film encapsulation layer including a stack of at least one inorganic encapsulation layer and at least one organic encapsulation layer.

Figure 4:
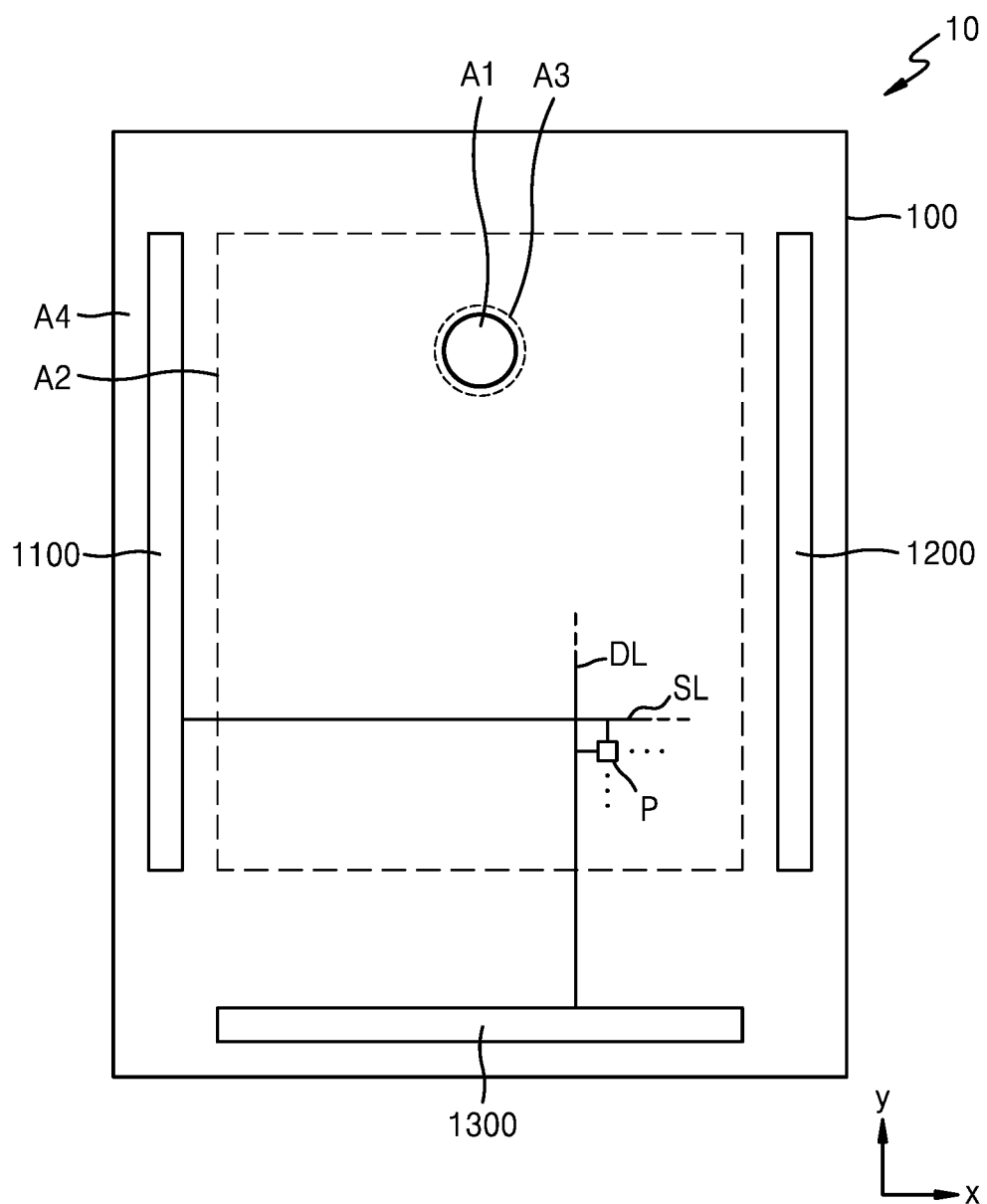
FIG. 4 is a plan view schematically illustrating a display panel according to an embodiment.
Figure 5:
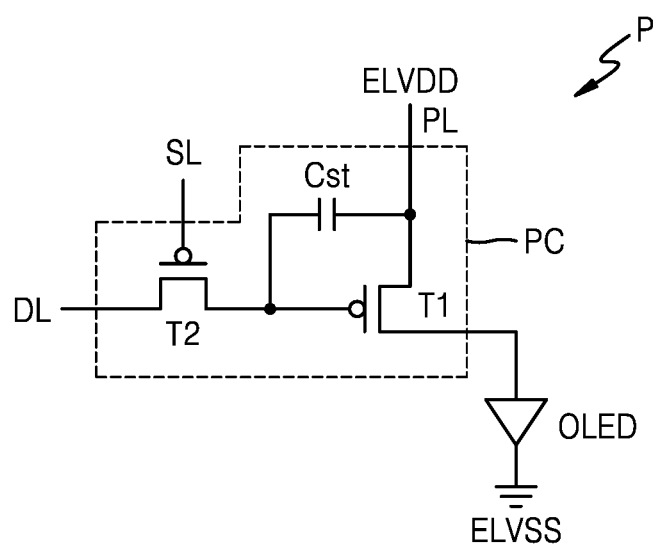
FIG. 5 is an equivalent circuit diagram schematically illustrating a pixel that may be applied to a display panel.

FIG. 4 is a plan view schematically illustrating a display panel according to an embodiment, and FIG. 5 is an equivalent circuit diagram schematically illustrating a pixel that may be included in a display panel.

The display panel 10 may include a first area A1, a second area A2 surrounding the first area A1, a third area A3 between the first area A1 and the second area A2, and a fourth area A4 surrounding the second area A2.

The display panel 10 may include a plurality of pixels P arranged in the second area A2. As illustrated in FIG. 5, each pixel P may include a pixel circuit PC and a display element coupled to the pixel circuit PC, for example, an organic light-emitting diode OLED. The pixel circuit PC may include a first transistor T1, a second transistor T2, and a storage capacitor Cst. Each pixel P may emit, for example, red, green, or blue light or red, green, blue, or white light from the organic light-emitting diode OLED. The first transistor T1 and the second transistor T2 may each be a thin film transistor.

As a switching transistor, the second transistor T2 may be coupled to a scan line SL and a data line DL and may be configured to transmit a data voltage input from the data line DL to the first transistor T1 according to a switching voltage input from the scan line SL. The storage capacitor Cst may be coupled to the second transistor T2 and a driving voltage line PL and may be configured to store a voltage corresponding to the difference between a voltage received from the second transistor T2 and a first power voltage ELVDD supplied to the driving voltage line PL.

As a driving transistor, the first transistor T1 may be coupled to the driving voltage line PL and the storage capacitor Cst and may be configured to control a driving current flowing from the driving voltage line PL through the organic light-emitting diode OLED in response to a voltage value stored in the storage capacitor Cst. The organic light-emitting diode OLED may emit light with a set or certain brightness according to the driving current. An opposite electrode (e.g., a cathode) of the organic light-emitting diode OLED may be supplied with a second power voltage ELVSS.

Although FIG. 5 illustrates that the pixel circuit PC includes two transistors and one storage capacitor, the present disclosure is not limited thereto. The number of transistors and the number of storage capacitors may be variously modified according to the design of the pixel circuit PC.

Referring back to FIG. 4, the third area A3 may surround the first area A1. Because the third area A3 is an area in which a display element such as an organic light-emitting diode emitting light is not arranged, signal lines providing signals to the pixels P provided around the first area A1 may be in and pass through the third area A3. A first scan driver 1100 and a second scan driver 1200 for providing a scan signal to each pixel P, a data driver 1300 for providing a data signal to each pixel P, and a main power line for providing the first and second power voltages may be arranged in the fourth area A4. The first scan driver 1100 and the second scan driver 1200 may be arranged in the fourth area A4 and may be respectively arranged at both sides of the second area A2 and having the second area A2 therebetween.

FIG. 4 illustrates that the data driver 1300 is arranged adjacent to one side of the substrate 100; however, according to other embodiments, the data driver 1300 may be arranged on a flexible printed circuit board (FPCB) electrically coupled to a pad arranged at one side of the display panel 10.

Figure 6:
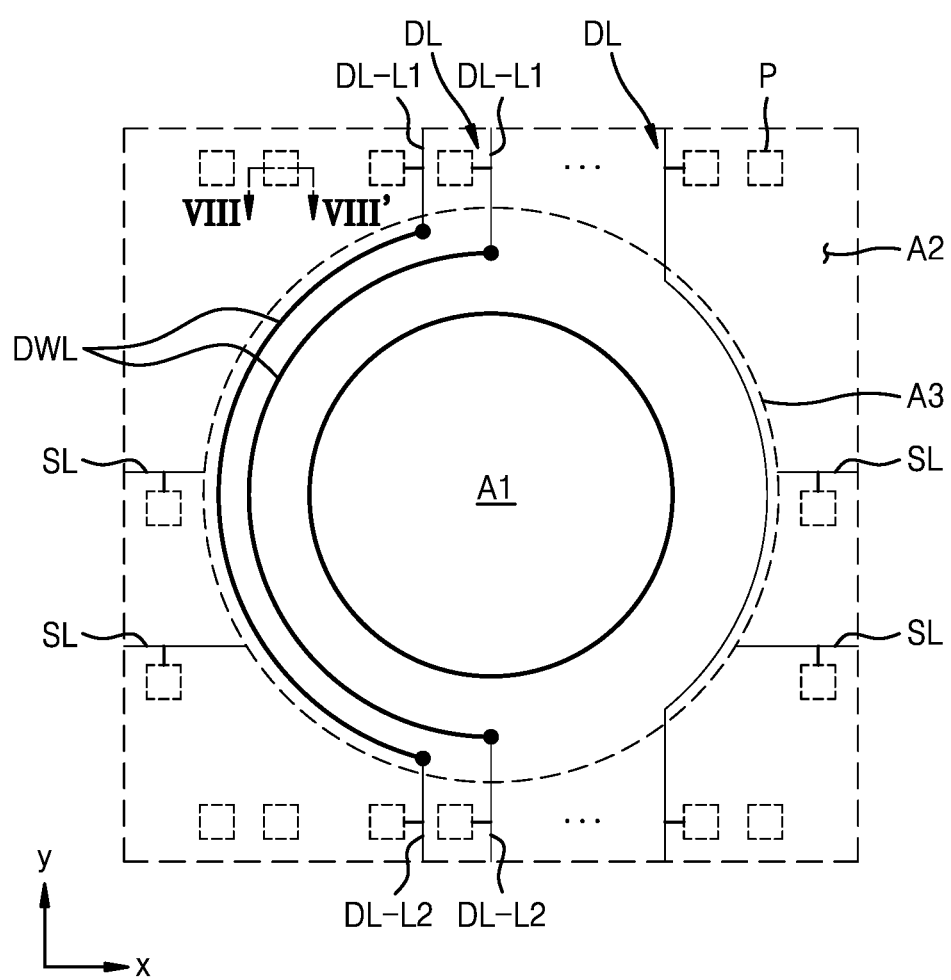
FIG. 6 is a plan view illustrating a portion of a display panel according to an embodiment.

FIG. 6 is a plan view illustrating a portion of a display panel according to an embodiment.

Referring to FIG. 6, some pixels P among the pixels P formed in the second area A2 may be spaced apart from each other and have the first area A1 therebetween. For example, the first area A1 may be located between two pixels P arranged in the ±x direction of FIG. 6. Similarly, the first area A1 may be located between two pixels P arranged in the ±y direction of FIG. 6.

Two pixels P arranged in the ±y direction with the first area A1 therebetween may be electrically coupled to the same data line DL, and the data line DL may be bent in the third area A3. For example, the data line DL may be arranged to bypass the first area A1. For example, a portion of the data line DL may be bent and extended along the periphery or edge of the first area A1 of the third area A3, for example, along a periphery or arc direction of the first area A1.

In other embodiments, the data line DL may be disconnected (e.g., separated) with the first area A1 therebetween. For example, the data line DL may include a first data line DL-L1 and a second data line DL-L2 spaced apart from each other and having the first area A1 therebetween. The first data line DL-L1 and the second data line DL-L2 may be coupled by a bypass line DWL. The bypass line DWL may be arranged on a different layer than the data line DL and coupled to the data line DL through a contact hole. The bypass line DWL may be arranged in the third area A3 and arranged to bypass along the periphery or edge of the first area A1.

Herein, the bypass line DWL may be not only a connection line for coupling the lines disconnected (e.g., separated) with the first area A1 therebetween, but also all the lines extending from the second area A2 and passing through the third area A3.

Two pixels P arranged in the ±x direction with the first area A1 therebetween may be electrically coupled to different scan lines SL. The scan lines SL arranged on the left side of the first area A1 may be electrically coupled to the first scan driver 1100 described above with reference to FIG. 4, and the scan lines SL arranged on the right side of the first area A1 may be electrically coupled to the second scan driver 1200 described above with reference to FIG. 4. As illustrated in FIG. 4, when the display panel 10 includes two scan driving circuits, the pixels P arranged on both sides of the first area A1 may be electrically coupled to the scan lines SL spaced apart from each other. For example, some scan lines SL may be spaced apart from each other and have the first area A1 therebetween.

In other embodiments, when the second scan driver 1200 is omitted, two pixels P arranged in the ±x direction with the first area A1 therebetween may be coupled to the same scan line. Like the data line DL, the scan line may include a bypass portion extending along the periphery or arc direction of the first area A1 in the third area A3.

Figure 7:
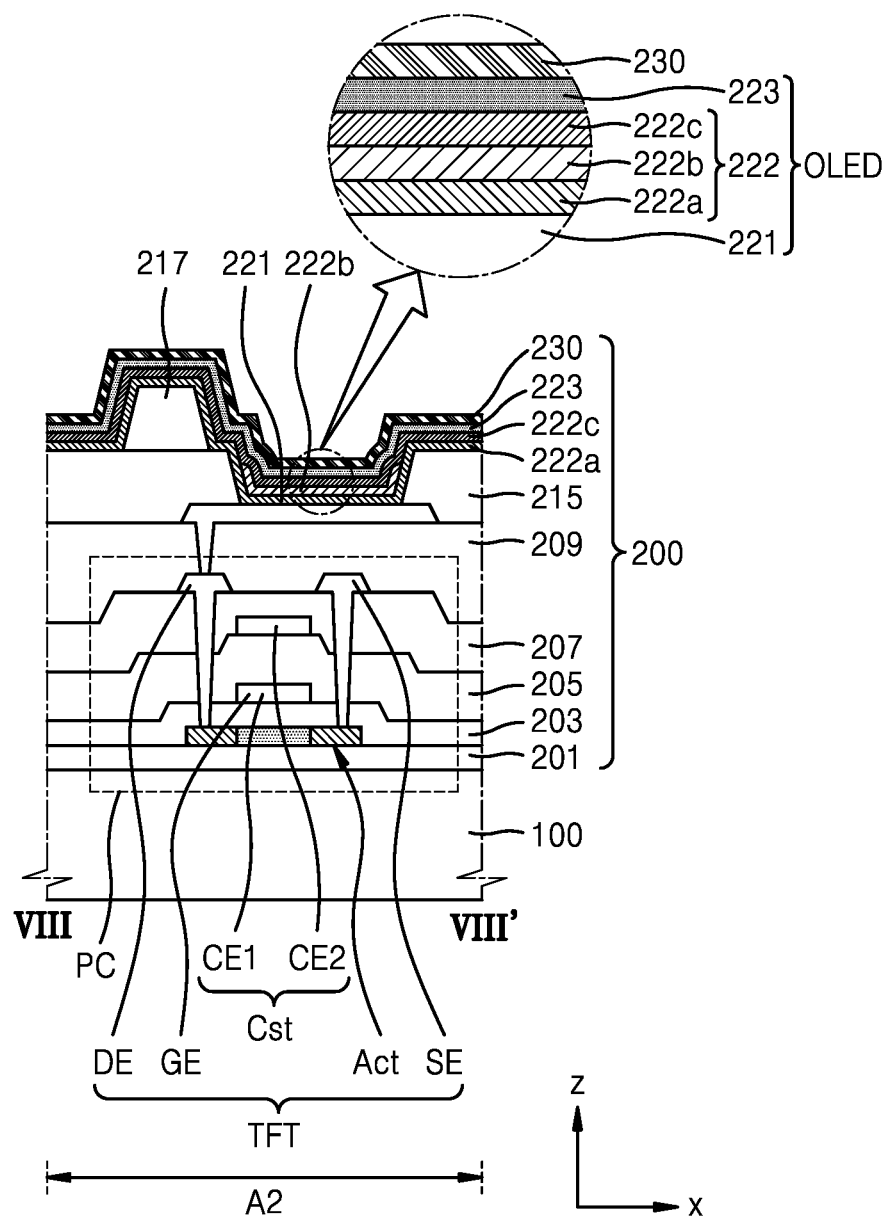
FIG. 7 is a cross-sectional view of any one pixel according to an embodiment, which may correspond to a cross section of the display panel taken along line VIII-VIII' of FIG. 6.

FIG. 7 is a cross-sectional view of any one pixel according to an embodiment, which may correspond to a cross-section of the display panel taken along line VIII-VIII' of FIG. 6.

Referring to FIG. 7, a pixel circuit PC may be arranged over a substrate 100, and an organic light-emitting diode OLED electrically coupled to the pixel circuit PC may be arranged over the pixel circuit PC. The substrate 100 may include glass and/or may include a polymer resin. The substrate 100 may include a single layer or a multiple layer.

A buffer layer 201 may be arranged on the substrate 100 to reduce or block the penetration of foreign materials, moisture, and/or external air from the bottom of the substrate 100 and may provide a flat surface on the substrate 100. The buffer layer 201 may include an inorganic material such as oxide and/or nitride, an organic material, and/or an organic/ inorganic composite and may include a single-layer or multi-layer structure of an inorganic material and an organic material. A barrier layer for blocking or reducing the penetration of external air may be further included between the substrate 100 and the buffer layer 201.

A pixel circuit PC may be arranged over the buffer layer 201. The pixel circuit PC may include a thin film transistor TFT and a storage capacitor Cst. The thin film transistor TFT may include a semiconductor layer Act, a gate electrode GE, a source electrode SE, and a drain electrode DE. In the present embodiment, a top gate type in which the gate electrode GE is arranged over the semiconductor layer Act with a gate insulating layer 203 therebetween is illustrated; however, according to other embodiments, the thin film transistor TFT may be a bottom gate type.

The semiconductor layer Act may include polysilicon. In some embodiments, the semiconductor layer Act may include amorphous silicon, may include an oxide semiconductor, or may include an organic semiconductor or the like. The gate electrode GE may include a low-resistance metal material. The gate electrode GE may include a conductive material including molybdenum (Mo), aluminum (Al), copper (Cu), titanium (Ti), and/or the like and may include a single layer or a multiple layer including the above material.

The gate insulating layer 203 between the semiconductor layer Act and the gate electrode GE may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_2$). The gate insulating layer 203 may include a single layer or a multiple layer including the above material.

The source electrode SE and the drain electrode DE may include a material having high conductivity (e.g., high electrical conductivity). The source electrode SE and the drain electrode DE may include a conductive material including molybdenum (Mo), aluminum (Al), copper (Cu), titanium (Ti), and/or the like and may include a single layer or a multiple layer including the above material. For example, the source electrode SE and the drain electrode DE may include a multilayer of Ti/Al/Ti.

The storage capacitor Cst may include a lower electrode CE1 and an upper electrode CE2 overlapping each other and having a first interlayer insulating layer 205 therebetween. The storage capacitor Cst may overlap the thin film transistor TFT. In this regard, FIG. 7 illustrates that the gate electrode GE of the thin film transistor TFT is the lower electrode CE1 of the storage capacitor Cst. In other embodiments, the storage capacitor Cst may not overlap the thin film transistor TFT. The storage capacitor Cst may be covered by a second interlayer insulating layer 207.

The first interlayer insulating layer 205 and the second interlayer insulating layer 207 may each include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_2$). The first interlayer insulating layer 205 and the second interlayer insulating layer 207 may each include a single layer or a multiple layer including the above material.

The pixel circuit PC including the thin film transistor TFT and the storage capacitor Cst may be covered by an organic insulating layer 209. The organic insulating layer 209 may be a planarization insulating layer and may include a substantially flat upper surface. The organic insulating layer 209 may include an organic insulating material such as a general-purpose polymer such as polymethylmethacrylate (PMMA) and/or polystyrene (PS), a polymer derivative having a phenolic group, an acrylic polymer, an imide-based polymer, an arylether-based polymer, an amide-based polymer, a fluorine-based polymer, a p-xylene-based polymer, a vinyl alcohol-based polymer, or any blend thereof. In an embodiment, the organic insulating layer 209 may include polyimide.

A pixel electrode 221 may be formed on the organic insulating layer 209. The pixel electrode 221 may include a conductive oxide such as indium tin oxide (ITO), indium zinc oxide (IZO), zinc oxide (ZnO), indium oxide ($In_2O_3$), indium gallium oxide (IGO), and/or aluminum zinc oxide (AZO). In other embodiments, the pixel electrode 221 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or any compound thereof. In other embodiments, the pixel electrode 221 may further include a layer formed of ITO, IZO, ZnO, and/or $In_2O_3$ over/under the reflective layer.

A pixel definition layer 215 may be formed on the pixel electrode 221. The pixel definition layer 215 may include an opening for exposing the upper surface of the pixel electrode 221 and may cover the periphery or edge of the pixel electrode 221. The pixel definition layer 215 may include an organic insulating material. In some embodiments, the pixel definition layer 215 may include an inorganic insulating material such as silicon nitride, silicon oxynitride, and/or silicon oxide. For example, the pixel definition layer 215 may include an organic insulating material and/or an inorganic insulating material An intermediate layer 222 may include an emission layer 222b. The emission layer 222b may include, for example, an organic material. The emission layer 222b may include a high-molecular and/or low-molecular weight organic material for emitting light of a certain color. The intermediate layer 222 may include a first functional layer 222a arranged under the emission layer 222b and/or a second functional layer 222c arranged over the emission layer 222b.

The first functional layer 222a may include a single layer or a multiple layer. For example, when the first functional layer 222a is formed of a high-molecular weight organic material, the first functional layer 222a may include a hole transport layer (HTL) that is a single-layer structure and may be formed of polyethylene dihydroxythiophene (PEDOT, poly-(3,4)-ethylene-dihydroxy thiophene) and/or polyaniline (PANI). When the first functional layer 222a is formed of a low-molecular weight organic material, the first functional layer 222a may include a hole injection layer (HIL) and/or a hole transport layer (HTL).

The second functional layer 222c may be optional. For example, when the first functional layer 222a and the emission layer 222b are formed of a high-molecular weight organic material, the second functional layer 222c may be formed. The second functional layer 222c may include a single layer or a multiple layer. The second functional layer 222c may include an electron transport layer (ETL) and/or an electron injection layer (EIL).

The emission layer 222b of the intermediate layer 222 may be arranged for each pixel in the second area A2. The emission layer 222b may be arranged to overlap the opening of the pixel definition layer 215 and/or the pixel electrode 221. Each of the first and second functional layers 222a and 222c of the intermediate layer 222 may be formed as a single body not only on the second area A2 but also on the third area A3 described above with reference to FIG. 4.

An opposite electrode 223 may include a conductive material having a low work function. For example, the opposite electrode 223 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or any alloy thereof. In some embodiments, the opposite electrode 223 may further include a layer such as ITO, IZO, ZnO, and/or $In_2O_3$ on the (semi)transparent layer including the above material. The opposite electrode 223 may be formed as a single body to cover a plurality of pixel electrodes 211 in the second area A2. The intermediate layer 222 and the opposite electrode 223 may be formed by thermal evaporation.

A spacer 217 may be formed on the pixel definition layer 215. The spacer 217 may include an organic insulating material such as polyimide. In some embodiments, the spacer 217 may include an inorganic insulating material such as silicon nitride and/or silicon oxide or may include an organic insulating material and an inorganic insulating material.

The spacer 217 may include a different material than the pixel definition layer 215. In some embodiments, the spacer 217 may include the same material (e.g., substantially the same material) as the pixel definition layer 215, and in this case, the pixel definition layer 215 and the spacer 217 may be formed together in a mask process using a halftone mask or the like. In an embodiment, the pixel definition layer 215 and the spacer 217 may include polyimide.

A capping layer 230 may be arranged on the opposite electrode 223. The capping layer 230 may include LiF, an inorganic material, and/or an organic material. In an embodiment, the capping layer 230 may be omitted.

Figure 8:
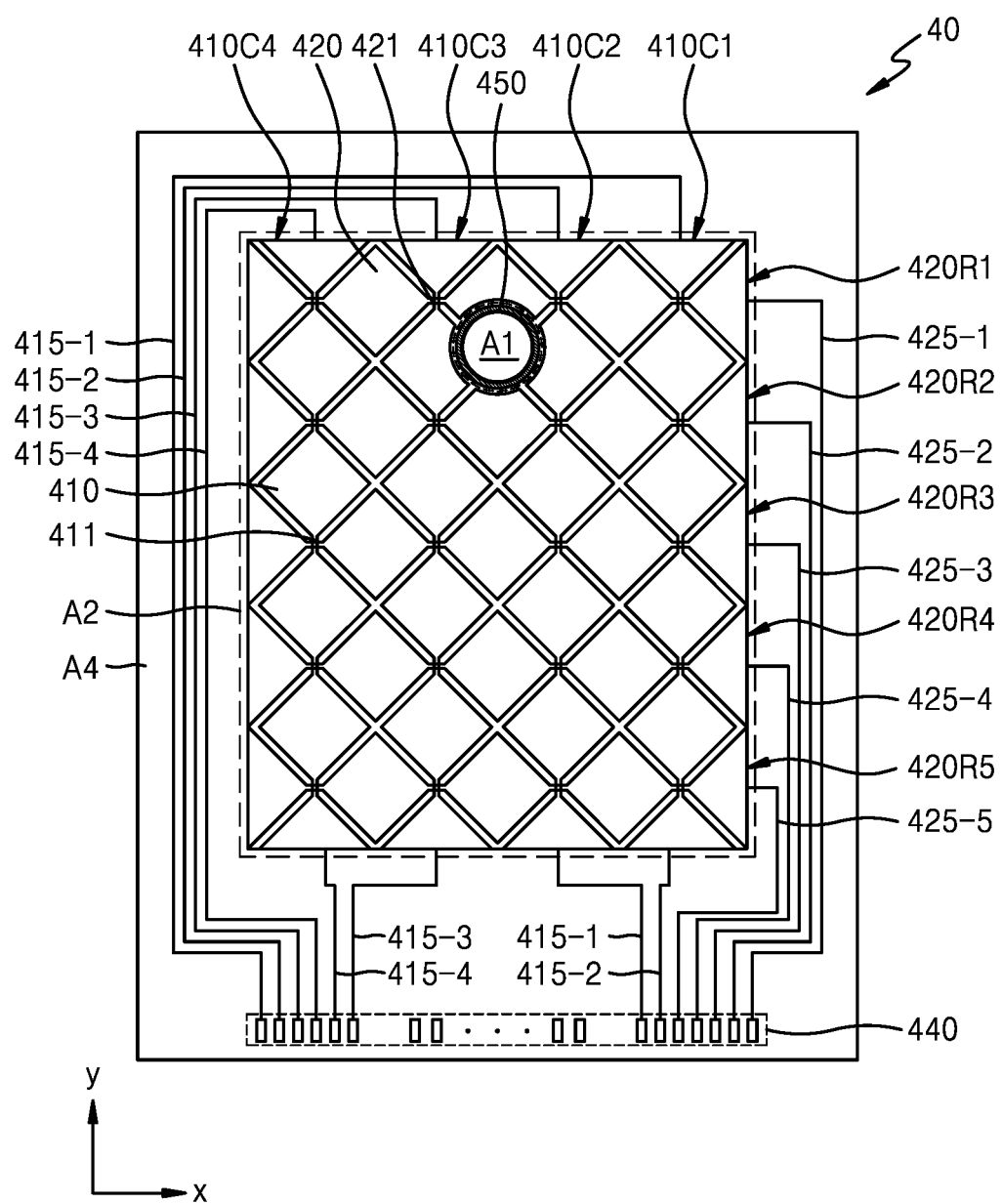
FIG. 8 is a plan view schematically illustrating an input sensing section on a display panel according to an embodiment.

FIG. 8 is a plan view schematically illustrating an input sensing section 40 on a display panel according to an embodiment.

Referring to FIG. 8, the input sensing section 40 may include first sensing electrodes 410, first trace lines 415-1 to 415-4 coupled to the first sensing electrodes 410, second sensing electrodes 420, and second trace lines 425-1 to 425-5 coupled to the second sensing electrodes 420. The first sensing electrodes 410 and the second sensing electrodes 420 may be arranged in the second area A2, and the first trace lines 415-1 to 415-4 and the second trace lines 425-1 to 425-5 may be arranged in the fourth area A4.

The first sensing electrodes 410 may be arranged in the ±y direction, and the second sensing electrodes 420 may be arranged in the ±x direction intersecting with the ±y direction. The first sensing electrodes 410 arranged in the ±y direction may be coupled to each other by a first connection electrode 411 between the first sensing electrodes 410, which are adjacent, and may form first sensing lines 410C1 to 410C4, respectively. The second sensing electrodes 420 arranged in the ±x direction may be coupled to each other by a second connection electrode 421 between the second sensing electrodes 420, which are adjacent, and may form second sensing lines 420R1 to 420R5, respectively. The first sensing lines 410C1 to 410C4 and the second sensing lines 420R1 to 420R5 may intersect with each other. For example, the first sensing lines 410C1 to 410C4 and the second sensing lines 420R1 to 420R5 may perpendicularly (e.g., substantially perpendicularly) intersect with each other.

The first sensing lines 410C1 to 410C4 may be coupled to the pads of a sensing signal pad section 440 through the first trace lines 415-1 to 415-4 formed in the fourth area A4. For example, the first trace lines 415-1 to 415-4 may have a double routing structure coupled to the upper and lower sides of the first sensing lines 410C1 to 410C4, respectively. The first trace lines 415-1 to 415-4 respectively coupled to the upper and lower sides of the first sensing lines 410C1 to 410C4 may be coupled to the corresponding pads, respectively.

The second sensing lines 420R1 to 420R5 may be coupled to the pads of the sensing signal pad section 440 through the second trace lines 425-1 to 425-5 formed in the fourth area A4. For example, the second trace lines 425-1 to 425-5 may be coupled to the corresponding pads, respectively.

As described above with reference to FIG. 2, the first area A1 may be an area in which a component may be arranged, and sensing electrodes may not be arranged in the first area A1. A metal layer 450 may be arranged around the first area A1, for example, in the third area A3, and the metal layer 450 will be described below.

FIG. 8 illustrates a double routing structure in which the first trace lines 415-1 to 415-4 are respectively coupled to the upper and lower sides of the first sensing lines 410C1 to 410C4, and this structure may improve the sensing sensitivity. In other embodiments, the first trace lines 415-1 to 415-4 may have a single routing structure coupled to the upper or lower side of the first sensing lines 410C1 to 410C4.

Figure 9:
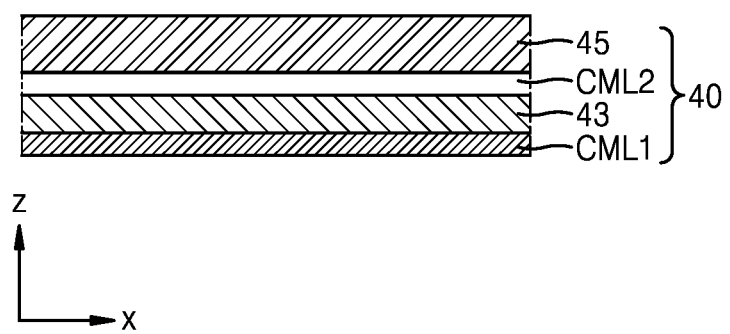
FIG. 9 is a cross-sectional view illustrating a stack structure of an input sensing section according to an embodiment.

FIG. 9 is a cross-sectional view illustrating a stack structure of an input sensing section 40 according to an embodiment.

Referring to FIG. 9, the input sensing section 40 may include a first conductive layer CML1 and a second conductive layer CML2. A first insulating layer 43 may be located between the first conductive layer CML1 and the second conductive layer CML2, and a second insulating layer 45 may be located on the second conductive layer CML2. Each of the first sensing electrodes 410, the first connection electrodes 411, the second sensing electrodes 420, and the second connection electrodes 421 described with reference to FIG. 8 may be included in one of the first conductive layer CML1 and the second conductive layer CML2.

The first and second conductive layers CML1 and CML2 may include a metal layer or a transparent conductive layer. The metal layer may include molybdenum (Mo), silver (Ag), titanium (Ti), copper (Cu), aluminum (Al), or any alloy thereof. The transparent conductive layer may include a transparent conductive oxide such as indium tin oxide (ITO), indium zinc oxide (IZO), zinc oxide (ZnO), and/or indium tin zinc oxide (ITZO). In addition or alternatively, the transparent conductive layer may include a conductive polymer (e.g., poly-(3,4)-ethylene-dihydroxy thiophene (PEDOT)), metal nanowire, graphene, and/or the like.

The first and second conductive layers CML1 and CML2 may each include a single layer or a multiple layer. The first and second conductive layers CML1 and CML2 including a single layer may include a metal layer or a transparent conductive layer, and the material of the metal layer and the transparent conductive layer may be the same as described above. One selected from the first and second conductive layers CML1 and CML2 may include a single metal layer. One selected from the first and second conductive layers CML1 and CML2 may include a multiple metal layer. The multiple metal layer may include, for example, three layers of titanium layer/aluminum layer/titanium layer. In some embodiments, the multiple metal layer may include a metal layer and a transparent conductive layer. The first and second conductive layers CML1 and CML2 may have different stack structures or may have the same stack structure. For example, the first conductive layer CML1 may include a metal layer and the second conductive layer CML2 may include a transparent conductive layer. In some embodiments, the first and second conductive layers CML1 and CML2 may include the same metal layer (e.g., substantially the same metal layer).

The material of the first and second conductive layers CML1 and CML2 and the arrangement of the sensing electrodes provided in the first and second conductive layers CML1 and CML2 may be determined in consideration of the sensing sensitivity of the sensing electrodes. A resistive-capacitive delay (RC delay) may affect the sensing sensitivity of the sensing electrodes, and because the sensing electrodes including the metal layer may have a low resistance in comparison with the transparent conductive layer, an RC value may be reduced and thus the charge time of a capacitor defined between the sensing electrodes may be reduced. In comparison with the metal layer, the sensing electrodes including the transparent conductive layer may not be visible to the user and the input area thereof may increase to increase the capacitance.

The first and second insulating layers 43 and 45 may each include an inorganic insulating material and/or an organic insulating material. The inorganic insulating material may include silicon oxide ($SiO_2$), silicon nitride ($SiN_x$), silicon oxynitride (SiON), or the like, and the organic insulating material may include a high-molecular weight organic material.

Some of the first and second sensing electrodes 410 and 420 and the first and second connection electrodes 411 and 421 described above with reference to FIG. 8 may be included in the first conductive layer CML1, and the others may be included in the second conductive layer CML2.

In an embodiment, the first conductive layer CML1 may include the first connection electrodes 411 (see FIG. 8), and the second conductive layer CML2 may include the first and second sensing electrodes 410 and 420 (see FIG. 8) and the second connection electrodes 421 (see FIG. 8). In other embodiments, the first conductive layer CML1 may include the first and second sensing electrodes 410 and 420 (see FIG. 8) and the second connection electrodes 421 (see FIG. 8), and the second conductive layer CML2 may include the first connection electrodes 411 (see FIG. 8). In other embodiments, the first conductive layer CML1 may include the first sensing electrodes 410 (see FIG. 8) and the first connection electrodes 411 (see FIG. 8) and the second conductive layer CML2 may include the second sensing electrodes 420 (see FIG. 8) and the second connection electrodes 421 (see FIG. 8), and in this case, because the first sensing electrodes 410 and the first connection electrodes 411 are provided in the same layer and integrally coupled with each other and the second sensing electrodes 420 and the second connection electrodes 421 are also provided in the same layer, a contact hole may not be provided in the insulating layer between the first conductive layer CML1 and the second conductive layer CML2.

FIG. 9 illustrates that the input sensing section 40 includes the first conductive layer CML1, the first insulating layer 43, the second conductive layer CML2, and the second insulating layer 45; however, in other embodiments, a buffer layer including an inorganic insulating material or an organic insulating material may be further arranged under the first conductive layer CML1.

Figure 10:
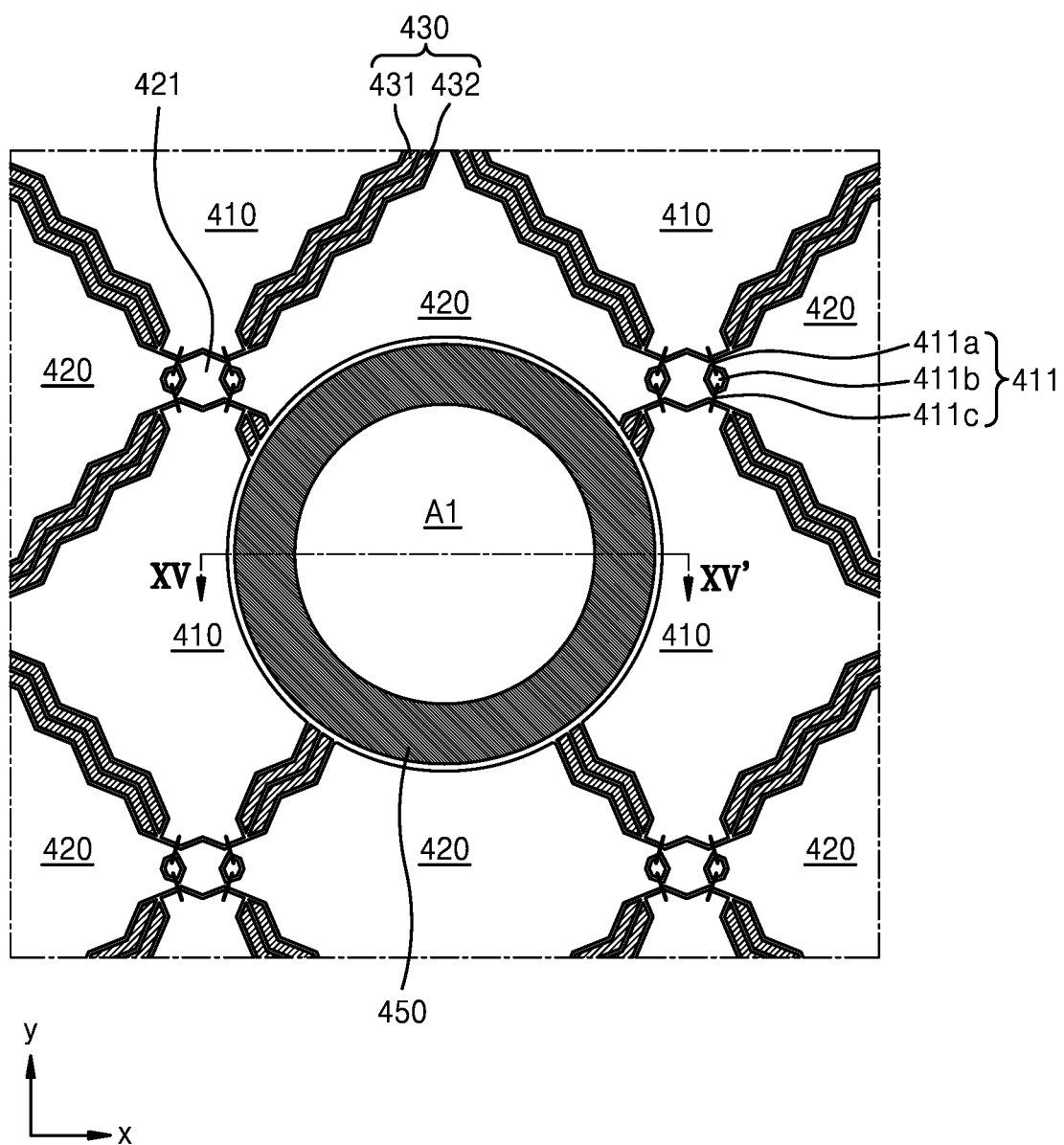
FIG. 10 is a plan view illustrating a portion of a display apparatus according to an embodiment.

FIG. 10 is a plan view illustrating a portion of a display apparatus according to an embodiment.

Referring to FIG. 10, the first sensing electrodes 410 may be arranged in the ±y direction and the second sensing electrodes 420 may be arranged in the ±x direction, wherein the second sensing electrodes 420, which are adjacent to each other, may be coupled to each other through the second connection electrode 421 located therebetween. The first sensing electrodes 410 that are adjacent to each other may be coupled through the first connection electrode 411, wherein the first connection electrode 411 may include an island portion 411b spaced apart from the first sensing electrode 410. The island portion 411b may be arranged in a hole formed in the second connection electrode 421 and may be spaced apart from the second connection electrode 421 and electrically insulated from the second connection electrode 421. As shown in FIG. 10, the first sensing electrodes 410 may also be arranged in the ±x direction, and the second sensing electrodes 420 may also be arranged in the ±y direction. The first sensing electrodes 410 adjacent to one another in the ±x direction may or may not be electrically coupled to one another, and the second sensing electrodes 420 adjacent to one another in the ±y direction may or may not be electrically coupled to one another.

Two of the first sensing electrodes 410 that are adjacent to one another, may include one of the first sensing electrodes 410 coupled to the island portion 411b through a first bridge portion 411a, and include the other of the first sensing electrodes 410 that are adjacent to each other coupled to the island portion 411b through a second bridge portion 411c. The first connection electrode 411 may include a connection structure of the first bridge portion 411a, the island portion 411b, and the second bridge portion 411c. In an embodiment, the island portions 411b may be arranged on the same layer as the first sensing electrodes 410, the second sensing electrodes 420, and the second connection electrodes 421. For example, the second conductive layer CML2 (see FIG. 9) described above with reference to FIG. 9 may include island portions 411b, first sensing electrodes 410, second sensing electrodes 420, and second connection electrodes 421. On the other hand, the first bridge portions 411a and the second bridge portions 411c may be arranged on a different layer than the island portions 411b. For example, the first conductive layer CML1 (see FIG. 9) described above with reference to FIG. 9 may include first bridge portions 411a and second bridge portions 411c.

A dummy electrode 430 may be arranged between the first sensing electrode 410 and the second sensing electrode 420 adjacent to each other. For example, as illustrated in FIG. 10, the dummy electrode 430 may include a first dummy electrode 431 and a second dummy electrode 432 extending along the periphery or edge of the first sensing electrode 410 or the second sensing electrode 420. For example, the first dummy electrode 431 and the second dummy electrode 432 may each have a zigzag shape. The dummy electrode 430 may be arranged to improve the sensing sensitivity of the sensing electrodes. The dummy electrode 430 may include a floating electrode.

The shape of the first sensing electrodes 410 and the second sensing electrodes 420 arranged around the first area A1 may be different from the shape of other sensing electrodes. The area of the first sensing electrodes 410 and the second sensing electrodes 420 arranged around the first area A1 may be smaller than the area of other sensing electrodes.

Each of the first sensing electrodes 410 and the second sensing electrodes 420 adjacent to (or nearest to) the first area A1 may include a rounded edge, and the arrangement of the respective rounded edges of the first sensing electrode 410 and the second sensing electrode 420 may have a shape surrounding the first area A1. For example, the first sensing electrodes 410 and the second sensing electrodes 420 adjacent to (or nearest to) the first area A1 may each have a shape that accommodates the first area A1 and/or any features surrounding the first area A1.

A metal layer 450 may be arranged between the first area A1 and the first and second sensing electrodes 410 and 420. The first sensing electrode 410 and the second sensing electrode 420 may be arranged in the second area A2 that is an active area, and the metal layer 450 may be arranged in the third area A3.

The metal layer 450 may be arranged in the third area A3 to cover the bypass lines DWL arranged in the third area A3. When the bypass lines DWLs are exposed without being covered because the metal layer 450 is not arranged, the external light incident through the first areas A1 may be visible by being reflected by the bypass lines DWL or may affect the characteristics of the component 20 (see FIG. 2) that may be arranged in the first area A1.

However, the present embodiments may minimize or reduce the influence of reflected light because the metal layer 450 arranged around the first area A1 blocks or reduces the external light that propagates obliquely.

The metal layer 450 may surround the first area A1 while having a set or certain width. The metal layer 450 may have a ring shape surrounding the first area A1 in a plan view. The metal layer 450 may include molybdenum (Mo), silver (Ag), titanium (Ti), copper (Cu), aluminum (Al), or any alloy thereof. The metal layer 450 may be in a floating state of not being electrically coupled to peripheral elements, for example, the first and second sensing electrodes 410 and 420 and the dummy electrode 430.

Figure 11A:
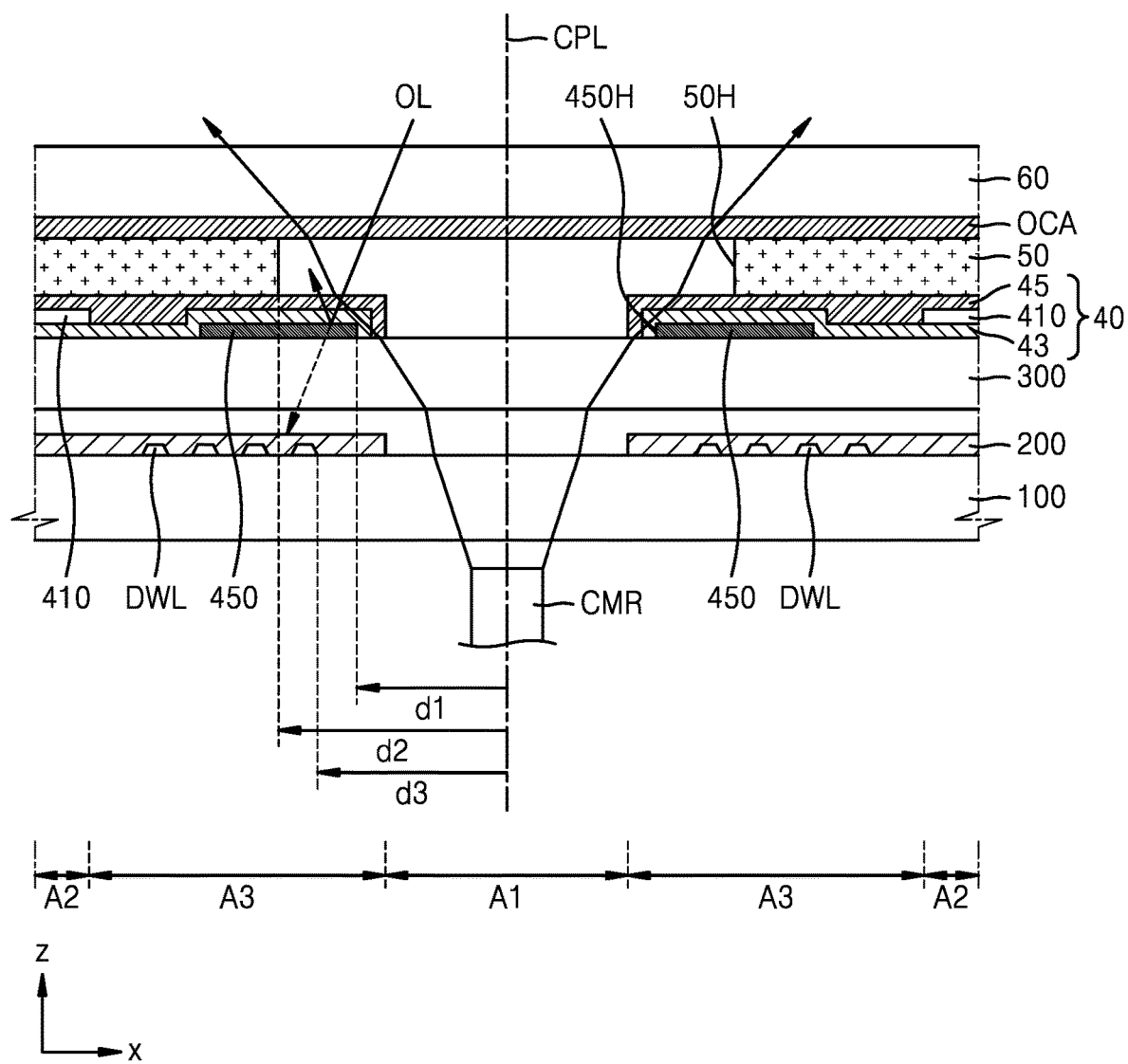
FIG. 11A is a cross-sectional view according to an embodiment, which may correspond to a cross-sectional view of the display apparatus taken along line XV-XV' of FIG. 10.
Figure 11B:
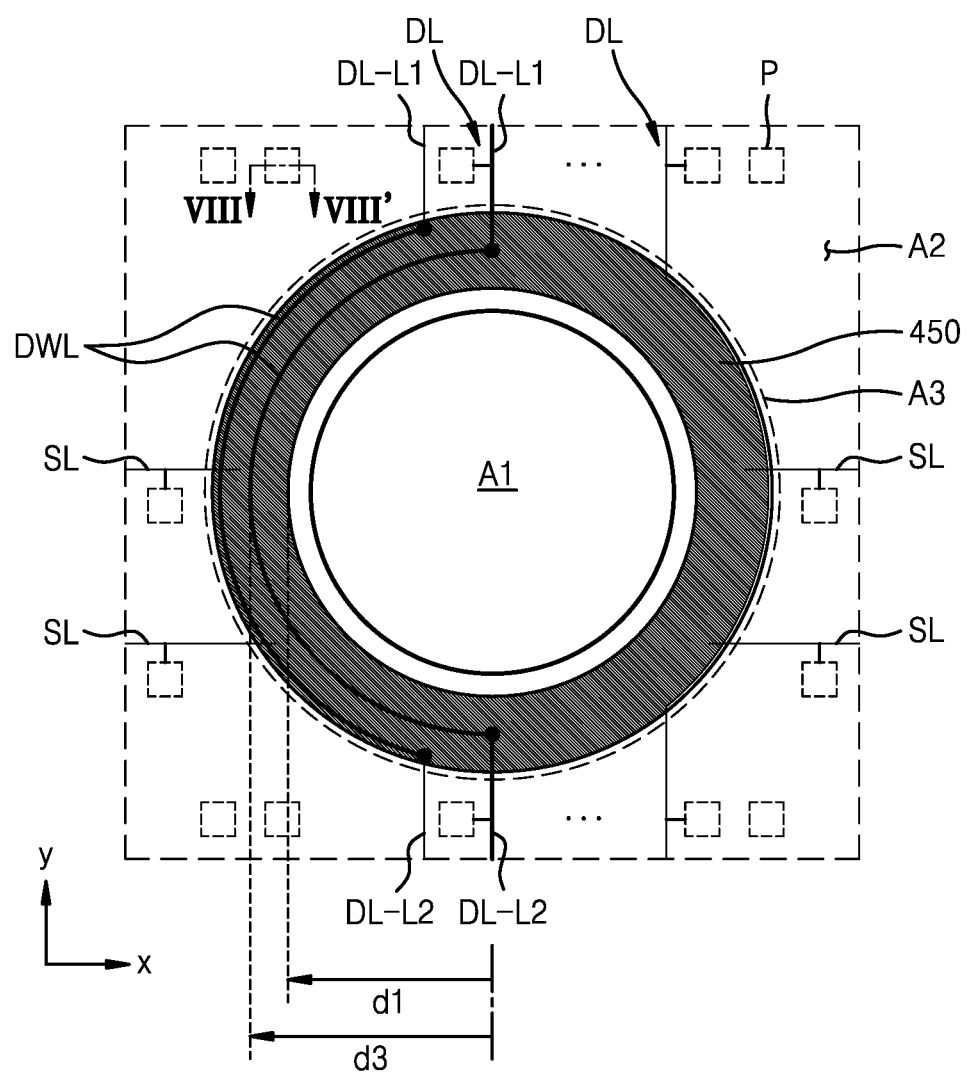
FIG. 11B is a plan view illustrating the positional relationship between a bypass line and a metal layer according to the present embodiment.

FIG. 11A is a cross-sectional view according to an embodiment, which may correspond to a cross-sectional view of the display apparatus taken along line XV-XV' of FIG. 10. FIG. 11B is a plan view illustrating the positional relationship between a bypass line and a metal layer according to the present embodiment.

Referring to FIGS. 11A and 11B, the display layer 200 arranged on the substrate 100 may include a plurality of pixels arranged in the second area A2, for example, organic light-emitting diodes. Also, the display layer 200 may include a bypass line DWL arranged in the third area A3.

An encapsulation member 300 may be arranged to cover the display layer 200. The encapsulation member 300 may be a component for encapsulating the display layer 200 and may be a rigid encapsulation substrate as described above with reference to FIG. 3. In other embodiments, the encapsulation member 300 may be a flexible thin film encapsulation layer.

The metal layer 450 may be arranged on the encapsulation member 300 and may include a first hole 450H corresponding to the first area A1. The input sensing section 40 may also be located on the encapsulation member 300, and the metal layer 450 may be arranged in the same layer as the input sensing section 40.

The metal layer 450 may be arranged under the first sensing electrode 410 with the first insulating layer 43 of the input sensing section 40 therebetween, and the first sensing electrode 410 may be covered by the second insulating layer 45. The metal layer 450 may be floated (e.g., spaced apart from) and electrically insulated from the input sensing section 40.

The metal layer 450 may be arranged to overlap the bypass lines DWL of the display layer 200.

Because the first area A1 is an area through which light may be transmitted, a component such as a sensor or a camera CMR arranged in the first area A1 may emit light toward the outside and/or receive external light. Because light propagates in various directions, external light OL propagating along an oblique direction toward the substrate 100 may propagate intactly (or indirectly) toward the display layer 200 in the absence of the metal layer 450 as indicated by a dotted line. However, according to embodiments, because the metal layer 450 is arranged to surround the first area A1, the metal layer 450 may reflect the obliquely-propagating external light OL to prevent or reduce the propagation of light to the display layer 200.

In the present embodiment, the periphery or edge of the first hole 450H may be provided closer to the first area A1 than the bypass line that is most adjacent to the first area A1 among the bypass lines DWL. This may be to prevent or reduce the exposure of bypass lines DWL to the external light OL propagating along an oblique direction, as described above.

The optical functional section 50 may be arranged on the input sensing section 40. The optical functional section 50 may include a second hole 50H located in the first area A1. The optical functional section 50 may include an external light reflecting element such as a phase retarder and/or a polarizer to prevent or reduce the reflection of the external light OL. In some embodiments, the optical functional section 50 may include an external light reflecting element such as a color filter, a black matrix, and/or a destructive interference structure to prevent or reduce the reflection of the external light OL.

The diameter of the second hole 50H of the optical functional section 50 may be larger than the diameter of the first hole 450H of the metal layer 450. Because the optical functional section 50 may prevent or reduce the reflection of the external light OL, the diameter of the second hole 50H of the optical functional section 50 may be formed to be substantially equal to the diameter of the first hole 450H of the metal layer 450; however, when the camera CMR is used as the component, the optical functional section 50 may restrict the angle of view of the camera CMR (e.g., wide-angle camera). The restriction of the angle of view may be caused more prominently (or more substantially) when the optical functional section 50 includes an external light reflecting element such as a polarizer that is relatively thick. Also, the restriction of the angle of view may be caused more prominently (or more substantially) according to a process error that may occur in the process of aligning the position of the second hole 50H of the optical functional section 50 to the first area A1 in the manufacturing process of the display apparatus.

However, according to embodiments, because the diameter of the second hole 50H of the optical functional section 50 is formed to be larger than the diameter of the first hole 450H of the metal layer 450, the angle of view of the camera CMR may not be restricted and a captured image of the camera CMR may not be damaged. The window 60 may be arranged over the optical functional section 50 through an optically clear adhesive OCA.

As described above, in the present embodiment, the distance from a center line CPL of the first area A1 to each component may be set in order to prevent or reduce the exposure of bypass lines DWL of the display layer 200 to the external light OL while considering the angle of view of the camera CMR. Here, the center line CPL may refer to a line that passes through the center (e.g., substantially the center) of the first area A1 and is perpendicular (e.g., substantially perpendicular) to the upper surface of the substrate 100.

For example, in the present embodiment, a first perpendicular distance d1 from the center line CPL to the periphery or edge of the first hole 450H may be less than a second perpendicular distance d2 from the center line CPL to the periphery or edge of the second hole 50H (d1<d2).

Also, the first perpendicular distance d1 may be less than a third perpendicular distance d3 from the center line CPL to the bypass line that is closest to the transmission area among the bypass lines DWL (d1<d3).

In some embodiments, the third perpendicular distance d3 may be less than the second perpendicular distance d2, which may be to reduce the area of the third area A3 that is a non-display area (d3<d2).

Figure 12:
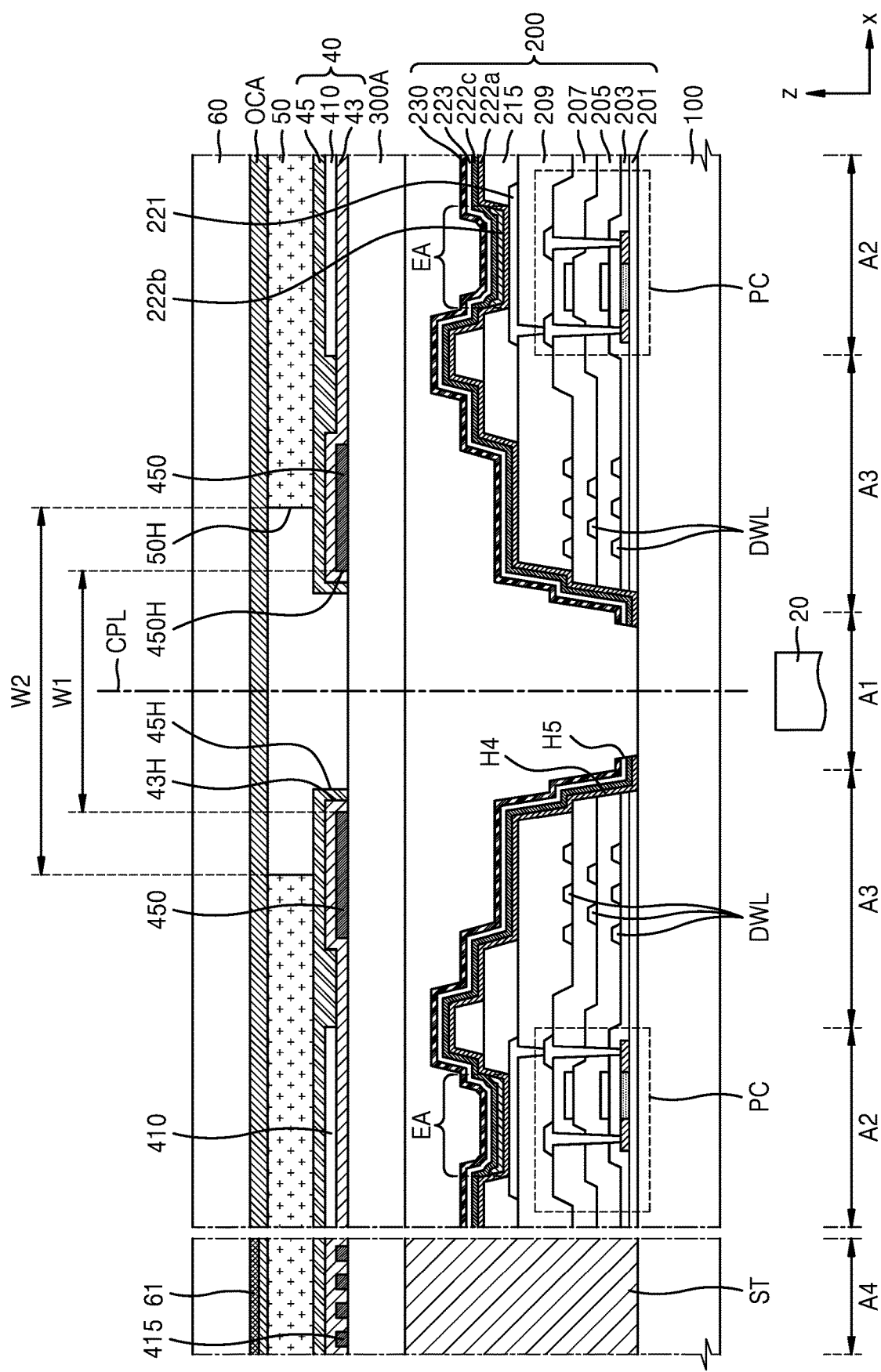
FIG. 12 is a cross-sectional view schematically illustrating a display apparatus according to an embodiment.
Figure 13:
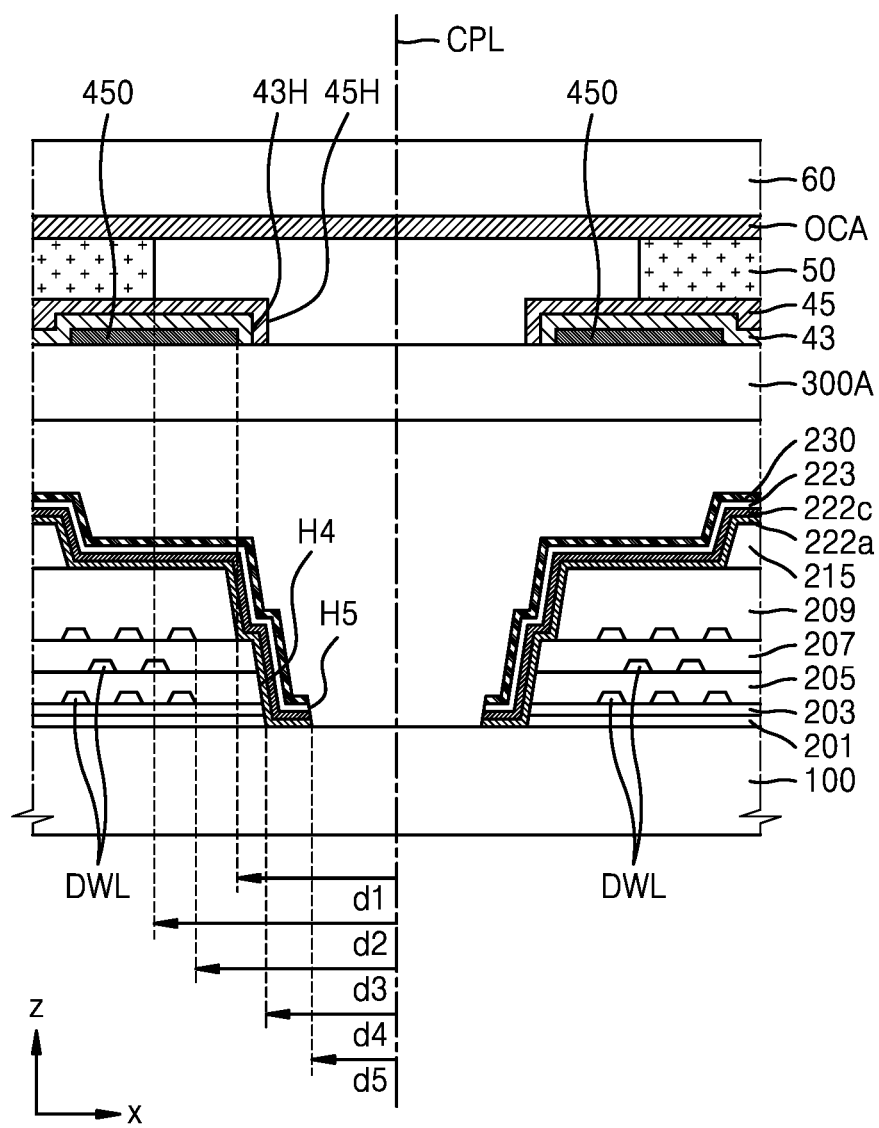
FIG. 13 is a cross-sectional view schematically illustrating a display apparatus according to an embodiment, which is an enlarged cross-sectional view of a portion of FIG. 12.

FIG. 12 is a cross-sectional view schematically illustrating a display apparatus according to an embodiment. FIG. 13 is an enlarged cross-sectional view of a portion of the first area A1 of FIG. 12.

Referring to FIG. 12, a buffer layer 201, a gate insulating layer 203, a first interlayer insulating layer 205, a second interlayer insulating layer 207, and an organic insulating layer 209 may be arranged over a substrate 100. A pixel circuit PC may include a thin film transistor and a storage capacitor, wherein the semiconductor layer and electrodes of the thin film transistor and the electrodes of the storage capacitor may be arranged on the above insulating layers, respectively.

A pixel electrode 221 may be coupled to the thin film transistor of the pixel circuit PC through the contact hole of the organic insulating layer 209.

A pixel definition layer 215 arranged on the pixel electrode 221 may include an opening that overlaps the pixel electrode 221, and the opening of the pixel definition layer 215 may define an emission area EA. A first functional layer 222a, an emission layer 222b, a second functional layer 222c, an opposite electrode 223, and a capping layer 230 may be sequentially arranged over the pixel definition layer 215. The material and feature of a display layer 200 arranged on the substrate 100 may be the same as described above with reference to FIG. 7.

Through holes corresponding to the first area A1 may be provided in the insulating layers, the first functional layer 222a, the second functional layer 222c, the opposite electrode 223, and the capping layer 230 may be included in the display layer 200. Accordingly, the light transmittance of the first area A1 may be increased by the presence of the through holes.

For example, the through holes respectively formed in the buffer layer 201, the gate insulating layer 203, the first interlayer insulating layer 205, the second interlayer insulating layer 207, the organic insulating layer 209, and the pixel definition layer 215 to correspond to the first area A1 may overlap each other to form a fourth hole H4. The fourth hole H4 may be defined as a hole having the smallest size among the through holes of the above insulating layers.

Also, the through holes respectively formed in the first functional layer 222a, the second functional layer 222c, the opposite electrode 223, and the capping layer 230 to correspond to the first area A1 may overlap each other to form a fifth hole H5. In this case, the diameter of the fifth hole H5 may be less than the diameter of the fourth hole H4. For example, the first functional layer 222a, the second functional layer 222c, the opposite electrode 223, and the capping layer 230 may be arranged at the side wall of the fourth hole H4.

In some embodiments, the diameter of the fourth hole H4 and/or the fifth hole H5 may be less than the diameter of a first hole 450H of a metal layer 450.

The insulating layers, the first functional layer 222a, the second functional layer 222c, the opposite electrode 223, and the capping layer 230 included in the display layer 200 may be members where the external light is not reflected and may be partially exposed without being entirely covered by the metal layer 450.

An encapsulation substrate 300A may be arranged to face the substrate 100. In the first area A1, the materials included in the display layer 200 may not be arranged between the bottom surface of the encapsulation substrate 300A and the upper surface of the substrate 100. In other words, in the first area A1, the upper surface of the substrate 100 may directly face the bottom surface of the encapsulation substrate 300A.

The encapsulation substrate 300A may include the same material (e.g., substantially the same material) as the substrate 100 and may have the same refractive index as the substrate 100. For example, the substrate 100 and the encapsulation substrate 300A may each (or together) have a refractive index of about 1.3 to about 1.7, for example, a refractive index of about 1.5.

The metal layer 450 may be arranged in the third area A3. The metal layer 450 may overlap the bypass lines DWLs arranged in the third area A3.

The metal layer 450 may directly contact (e.g., physically contact) the upper surface of the encapsulation substrate 300A. The metal layer 450 may be formed in the same process (e.g., substantially the same process) as a process of forming the input sensing section 40, for example, a process of forming the trace line and the first connection electrode. In this regard, FIG. 12 illustrates that the first trace lines 415 and the metal layer 450 located in the fourth area A4 are arranged directly at the upper surface of the encapsulation substrate 300A. At least one of the trace lines located in the fourth area A4, for example, the first trace lines 415, may overlap the sealant ST.

A first insulating layer 43 such as a silicon nitride, a silicon oxide, or a silicon oxynitride may be arranged on the metal layer 450. Sensing electrodes and a second insulating layer 45 may be sequentially arranged over the first insulating layer 43. The first insulating layer 43 and the second insulating layer 45 may respectively include holes 43H and 45H located in the first area A1.

An end portion of the first insulating layer 43 may cover an inner edge of the metal layer 450, and an end portion of the second insulating layer 45 may cover an end portion of the first insulating layer 43 described above. The first insulating layer 43 and the second insulating layer 45 may include the same material (e.g., substantially the same material) or may include different materials. Each of the first insulating layer 43 and the second insulating layer 45 may include an inorganic material and/or an organic material.

FIG. 12 illustrates that the metal layer 450 is arranged under the first insulating layer 43. In other embodiments, the sensing electrodes including the first sensing electrode 410 and the second connection electrode may be arranged under the first insulating layer 43, the trace line may be arranged over the first insulating layer 43, and the metal layer 450 may be formed together and arranged on the first insulating layer 43 in the process of forming the trace lines.

An optical functional section 50 may be arranged to cover a portion of the metal layer 450, and an optically clear adhesive (OCA) and a window 60 may be arranged thereover. A light blocking portion 61 may be arranged at the rear surface of the window 60 to cover the components arranged in the fourth area A4, for example, components such as the first trace line 415. The light blocking portion 61 covering a dead area may include a color layer. For example, the light blocking portion 61 may include layers of various suitable colors such as white, black, silver, gold, and/or pink. The light blocking portion 61 may have a frame shape or a polygonal ring surrounding the second area A2. For example, the light blocking portion 61 may have a substantially rectangular ring or a frame shape.

A second hole 50H of the optical functional section 50 may overlap the first hole 450H of the metal layer 450. In regard to an alignment error in the assembly process of the display apparatus and/or the quality of an image captured by a camera when the component 20 is the camera, a first width W1 of the first hole 450H of the metal layer 450 may be less than a second width W2 of the second hole 50H of the optical functional section 50.

In the present embodiment, the distance from the center line CPL of the first area A1 to each component may be set in order to prevent or reduce the exposure of the bypass lines DWL of the display layer 200 to the external light OL while considering the angle of view of the camera CMR. Also, the distance from the center line CPL to each component may be set in order to reduce the area of the third area A3 that is a non-display area.

For example, referring to FIG. 13, a first perpendicular distance d1 from the center line CPL to the periphery or edge of the first hole 450H may be less than a second perpendicular distance d2 from the center line CPL to the periphery or edge of the second hole 50H (d1<d2).

Also, the first perpendicular distance d1 may be less than a third perpendicular distance d3 from the center line CPL to the bypass line that is closest to the transmission area among the bypass lines DWL (d1<d3). In this case, the difference between the first perpendicular distance d1 and the third perpendicular distance d3 may be about 5 μm to about 10 μm.

In some embodiments, the third perpendicular distance d3 may be less than the second perpendicular distance d2, which may be to reduce the area of the third area A3 that is a non-display area (d3<d2).

A fourth perpendicular distance d4 from the center line CPL to the periphery or edge of the fourth hole H4 formed in the insulating layers of the display layer 200 may be less than the first perpendicular distance d1 (d1>d4).

In some embodiments, a fifth perpendicular distance d5 from the center line CPL to the periphery or edge of the fifth hole H5 formed in the opposite electrode 223 of the display layer 200 may be less than the first perpendicular distance d1 (d1>d5). Accordingly, the opposite electrode 223 may be arranged at the side wall of the fourth hole H4.

In some embodiments, in order to form the fifth hole H5, the opposite electrode 223 may be removed by using a laser. In this case, when the fifth hole H5 is formed larger than the fourth hole H4, the insulating layer of the display layer 200 may be damaged by the laser and/or outgassing may occur. In the present embodiment, the fifth hole H5 may be designed to be arranged inside the fourth hole H4, thereby preventing or reducing damage to the display layer 200.

In some embodiments, the opposite electrode 223 may be transparent and the reflection of external light may not occur.

Figure 14A:
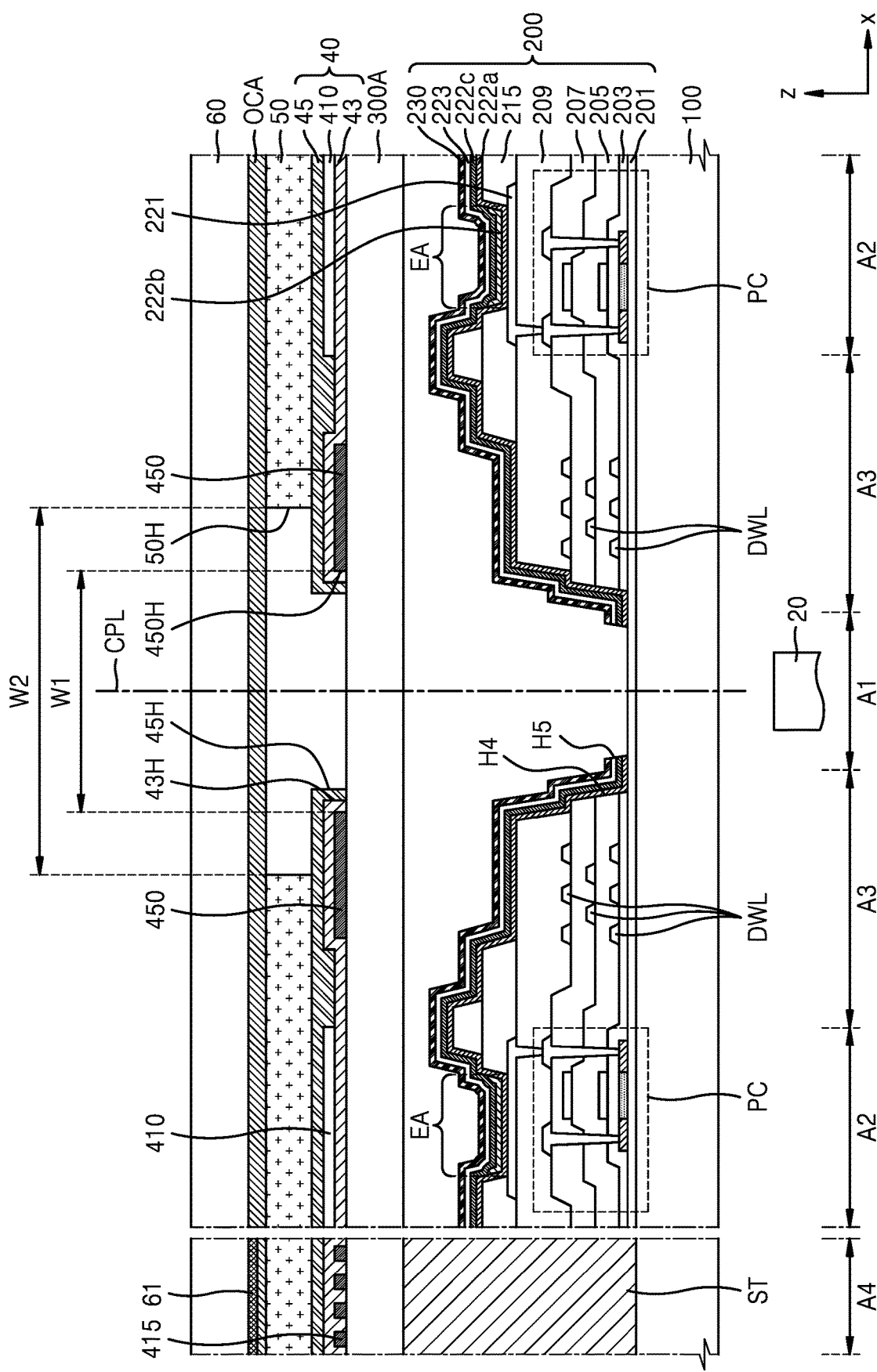
FIG. 14A is a cross-sectional view schematically illustrating a display apparatus according to an embodiment.
Figure 14B:
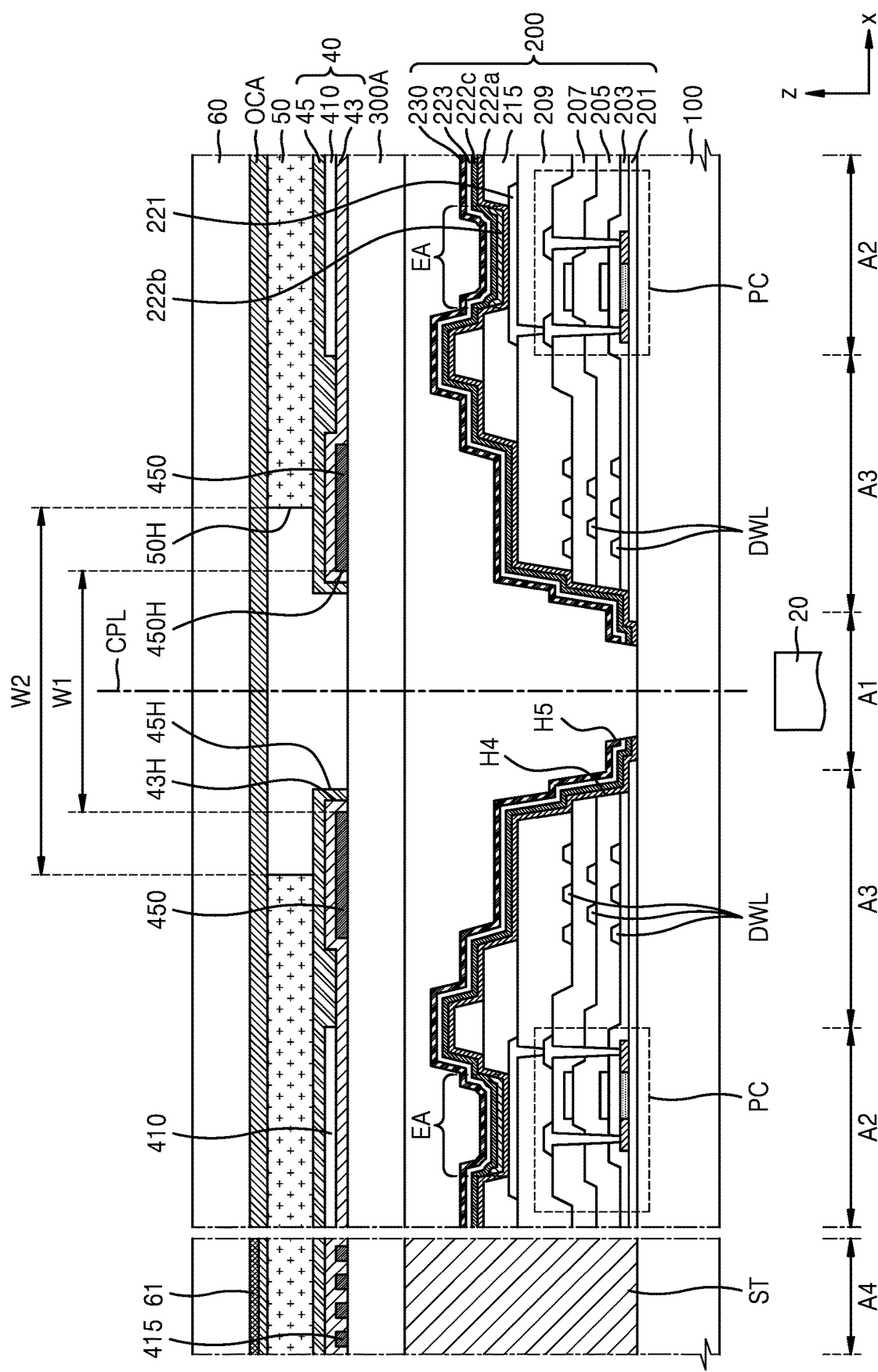
FIG. 14B is a cross-sectional view schematically illustrating a display apparatus according to an embodiment.

FIGS. 14A and 14B are cross-sectional views schematically illustrating display apparatuses according to embodiments. In FIGS. 14A and 14B, like reference numerals as in FIG. 12 denote like members and thus redundant descriptions thereof will not be repeated here in the interest of conciseness.

Referring to FIG. 14A, the display apparatus may include a substrate 100 including a first area A1 as a transmission area, a display layer 200, an encapsulation substrate 300A, a metal layer 450, and an optical functional section 50, and the metal layer 450 may be arranged to cover the bypass line DWL arranged in the third area A3 of the display layer 200. The metal layer 450 and the optical functional section 50 may respectively include a first hole 450H and a second hole 50H corresponding to the first area A1.

The second hole 50H of the optical functional section 50 may overlap the first hole 450H of the metal layer 450. In regard to an alignment error in the assembly process of the display apparatus and/or the quality of an image captured by a camera when the component 20 is the camera, a first width W1 of the first hole 450H of the metal layer 450 may be less than a second width W2 of the second hole 50H of the optical functional section 50. Also, the inner edge of the metal layer 450 may be arranged more adjacent to the first area A1 than the bypass lines DWL.

In an embodiment, at least one of the insulating layers of the display layer 200 may be continuously arranged to correspond to the first area A1, or may continuously surround the first area A1. In this regard, FIG. 14A illustrates that a buffer layer 201 is continuously arranged from the second area A2 to the first area A1. The buffer layer 201 may be formed of a material and a thickness capable of securing light transmittance. The buffer layer 201 may function as a barrier layer. For example, the buffer layer 201 may function to block the moisture or the like that may penetrate from the bottom of the substrate 100.

In other embodiments, the buffer layer 201 may include a hole corresponding to the first area A1, wherein the size of the hole may be different from that of the overlying insulating layers. In this regard, in FIG. 14B, the hole size of the buffer layer 201 may be less than the hole size of the insulating layers 203, 205, and 207 arranged thereover. Accordingly, in the first area A1, the side surfaces of the buffer layer 201 and the overlying insulating layers 203, 205, and 207 may form a step. This may be because a process of forming a hole in the buffer layer 201 is performed in a different operation than a process of forming a hole in the insulating layers 203, 205, and 207 arranged thereover.

Figure 15:
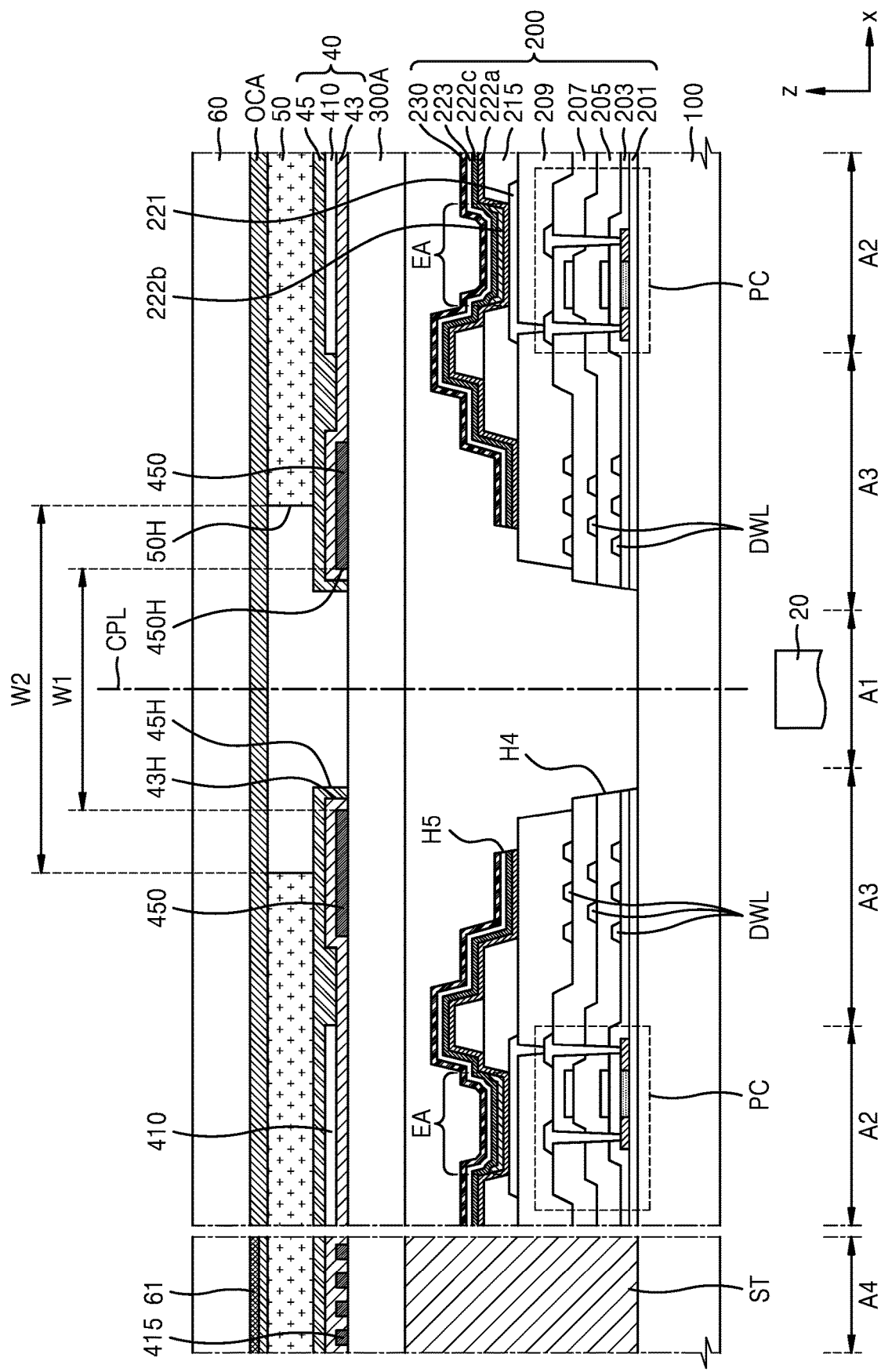
FIG. 15 is a cross-sectional view schematically illustrating a display apparatus according to an embodiment.

FIG. 15 is a cross-sectional view schematically illustrating a display apparatus according to an embodiment. In FIG. 15, like reference numerals as those in FIG. 12 denote like members and thus redundant descriptions thereof will not be repeated here in the interest of conciseness.

Referring to FIG. 15, the display apparatus may include a substrate 100 including a first area A1 as a transmission area, a display layer 200, an encapsulation substrate 300A, a metal layer 450, and an optical functional section 50, and the metal layer 450 may be arranged to cover the bypass line DWL arranged in the third area A3 of the display layer 200. The metal layer 450 and the optical functional section 50 may respectively include a first hole 450H and a second hole 50H corresponding to the first area A1.

The second hole 50H of the optical functional section 50 may overlap the first hole 450H of the metal layer 450. In regard to an alignment error in the assembly process of the display apparatus and/or the quality of an image captured by a camera when the component 20 is the camera, a first width W1 of the first hole 450H of the metal layer 450 may be less than a second width W2 of the second hole 50H of the optical functional section 50. Also, the inner edge of the metal layer 450 may be arranged more adjacent to the first area A1 than the bypass lines DWL.

In some embodiments, a fifth hole H5 provided in the opposite electrode 223 may be larger than a fourth hole H4 provided in the insulating layer of the display layer 200. In this case, when the opposite electrode 233 is deposited, the opposite electrode 223 may be formed by using a mask having a shielding film corresponding to the fifth hole H5. In this case, unlike in the embodiment of FIG. 12, the size of the fifth hole H5 may be larger than the size of the first hole 450H provided in the metal layer 450.

Figure 16:
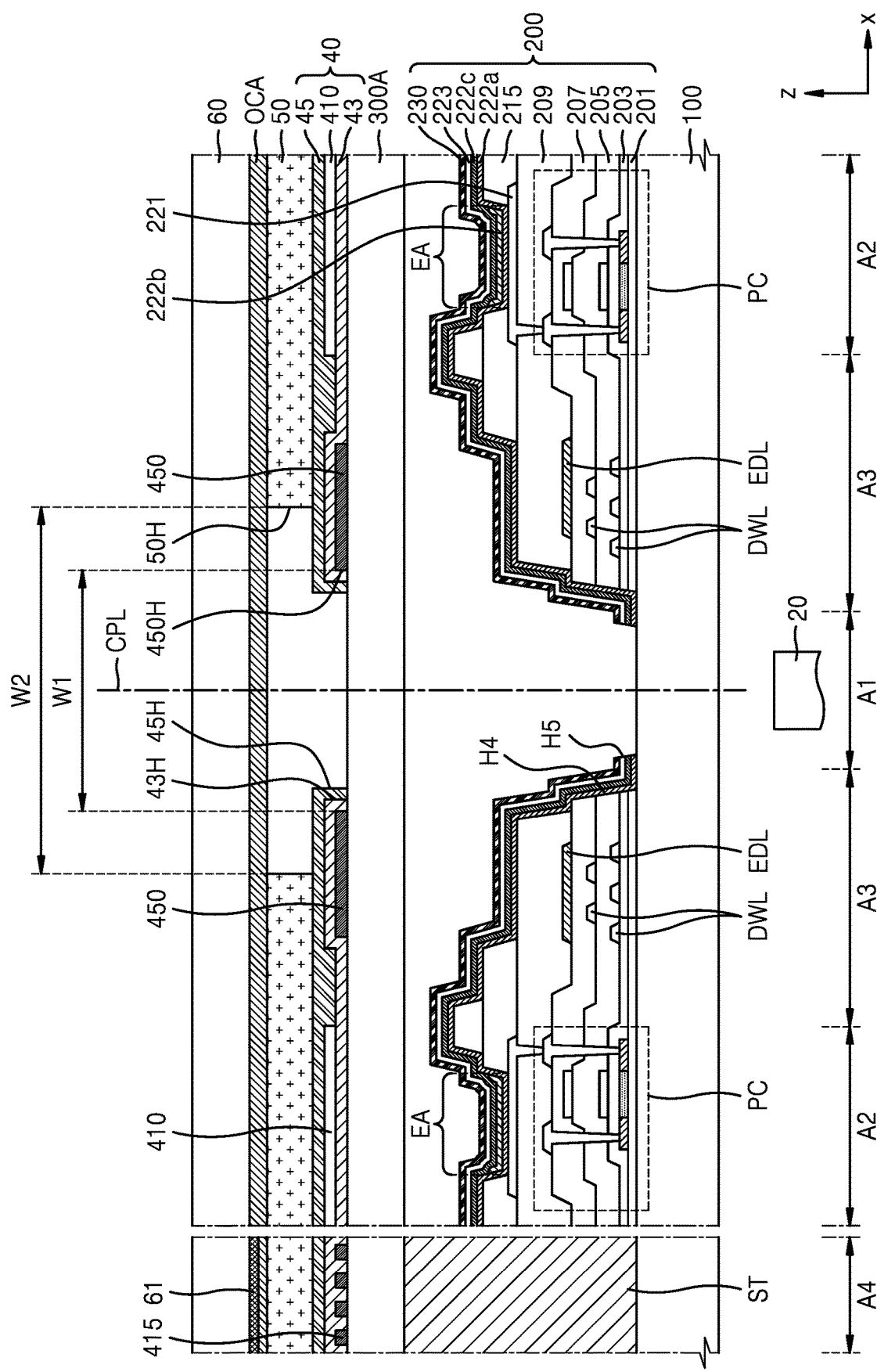
FIG. 16 is a cross-sectional view schematically illustrating a display apparatus according to an embodiment.

FIG. 16 is a cross-sectional view schematically illustrating a display apparatus according to an embodiment. In FIG. 16, like reference numerals as those in FIG. 12 denote like members and thus redundant descriptions thereof will not be repeated here in the interest of conciseness.

Referring to FIG. 16, the display apparatus may include a substrate 100 including a first area A1 as a transmission area, a display layer 200, an encapsulation substrate 300A, a metal layer 450, and an optical functional section 50, and the metal layer 450 may be arranged to cover the bypass line DWL arranged in the third area A3 of the display layer 200. The metal layer 450 and the optical functional section 50 may respectively include a first hole 450H and a second hole 50H corresponding to the first area A1.

The second hole 50H of the optical functional section 50 may overlap the first hole 450H of the metal layer 450. In regard to an alignment error in the assembly process of the display apparatus and/or the quality of an image captured by a camera when the component 20 is the camera, a first width W1 of the first hole 450H of the metal layer 450 may be less than a second width W2 of the second hole 50H of the optical functional section 50. Also, the inner edge of the metal layer 450 may be arranged more adjacent to the first area A1 than the bypass lines DWL.

In the present embodiment, an electrode layer EDL overlapping a plurality of bypass lines DWL may be arranged on the second interlayer insulating layer 207. The electrode layer EDL may be coupled to various suitable lines to provide a constant voltage. For example, the electrode layer EDL may be coupled to the driving voltage line PL. In some embodiments, the electrode layer EDL may be coupled to an initialization voltage line for initializing the pixel circuit. The electrode layer EDL may be arranged to surround the first area A1. For example, the electrode layer EDL may be provided in a donut shape.

As described above, according to embodiments of the present disclosure, a display apparatus including a display panel having a transmission area inside a display area, which may minimize or reduce the influence of external light, may be provided.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the present disclosure as defined by the appended claims, and equivalents thereof.

What is claimed is:

1. A display apparatus comprising:
a substrate including a transmission area,
a display area surrounding the transmission area, and
a first non-display area between the transmission area and the display area;
a display layer including display elements in the display area and bypass lines in the first non-display area;
an encapsulation member that covers the display elements and the bypass lines;
a metal layer on the encapsulation member, overlapping the bypass lines, and including a first hole corresponding to the transmission area;
an optical functional section including a second hole corresponding to the transmission area and overlapping the first hole of the metal layer; and
an input sensing section on the encapsulation member and including sensing electrodes and trace lines electrically coupled to the sensing electrodes,
wherein the metal layer is in a same layer as the input sensing section.

2. The display apparatus of claim 1, wherein the metal layer includes a same material as the trace lines.

3. The display apparatus of claim 1, wherein the metal layer has a ring shape.

4. The display apparatus of claim 1, wherein the input sensing section includes at least one conductive layer including the sensing electrodes or the trace lines and an insulating layer on the at least one conductive layer, and
wherein the insulating layer covers an edge of the metal layer defining the first hole.

5. The display apparatus of claim 1, wherein the display layer includes a plurality of insulating layers,
at least one of the plurality of insulating layers includes a hole corresponding to the transmission area.

6. The display apparatus of claim 5, wherein at least one of the plurality of insulating layers continuously surrounds the transmission area.

7. The display apparatus of claim 1, wherein the display layer includes an opposite electrode provided in common to the display elements, the opposite electrode includes an electrode-hole corresponding to the transmission area.

8. The display apparatus of claim 1, wherein the display layer includes a plurality of insulating layers and an opposite electrode, and
the plurality of insulating layers include a hole corresponding to the transmission area.

9. The display apparatus of claim 1, further comprising a window over the optical functional section, and a transparent adhesive layer between the optical functional section and the window.

10. The display apparatus of claim 1, wherein at least one of the substrate or the sealing member includes a glass material.

11. The display apparatus of claim 1, further comprising a camera under the substrate, and overlapping the first hole.

12. A display panel comprising:
a substrate including a transmission area,
a display area surrounding the transmission area, and
a first non-display area between the transmission area and the display area;
a display layer including display elements in the display area and bypass lines in the first non-display area;
an encapsulation member that covers the display elements and the bypass lines;
a metal layer on the encapsulation member, overlapping the bypass lines, and including a first hole corresponding to the transmission area; and
an input sensing section on the encapsulation member and including sensing electrodes and trace lines electrically coupled to the sensing electrodes,
wherein the metal layer is in a same layer as the input sensing section.

13. The display panel of claim 12, wherein the metal layer includes a same material as the trace lines.

14. The display panel of claim 12, wherein the metal layer has a ring shape.

15. The display panel of claim 12, wherein the input sensing section includes at least one conductive layer including the sensing electrodes or the trace lines and an insulating layer on the at least one conductive layer, and
wherein the insulating layer covers an edge of the metal layer defining the first hole.

16. The display panel of claim 12, wherein the display layer includes a plurality of insulating layers,
at least one of the plurality of insulating layers includes a hole corresponding to the transmission area.

17. The display panel of claim 16, wherein at least one of the plurality of insulating layers continuously surrounds the transmission area.

18. The display panel of claim 12, wherein the display layer includes an opposite electrode provided in common to the display elements, the opposite electrode includes an electrode-hole corresponding to the transmission area.

19. The display panel of claim 12, further comprising an optical functional section including a second hole corresponding to the transmission area and overlapping the first hole of the metal layer.

20. The display panel of claim 12, wherein at least one of the substrate or the sealing member includes a glass material.

* * * * *